(12) United States Patent
Hamada et al.

(10) Patent No.: US 10,803,922 B2
(45) Date of Patent: Oct. 13, 2020

(54) APPARATUSES AND METHODS FOR INTERNAL VOLTAGE GENERATING CIRCUITS

(71) Applicant: Micron Technology, Inc., Boise, ID (US)

(72) Inventors: Takayori Hamada, Sagamihara (JP); Yuki Miura, Sagamihara (JP); Hiroshi Shimizu, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 21 days.

(21) Appl. No.: 16/146,811

(22) Filed: Sep. 28, 2018

(65) Prior Publication Data

US 2020/0105332 A1  Apr. 2, 2020

(51) Int. Cl.
| | | |
|---|---|---|
| *G11C 11/4074* | (2006.01) | |
| *G11C 5/14* | (2006.01) | |
| *G11C 11/4091* | (2006.01) | |
| *G11C 11/4094* | (2006.01) | |
| G11C 11/408 | (2006.01) | |
| G05F 1/46 | (2006.01) | |

(52) U.S. Cl.
CPC .......... *G11C 11/4074* (2013.01); *G11C 5/147* (2013.01); *G11C 11/4091* (2013.01); *G11C 11/4094* (2013.01); *G05F 1/465* (2013.01); *G11C 11/4085* (2013.01); *G11C 2207/005* (2013.01)

(58) Field of Classification Search
CPC ............ G11C 11/4074; G11C 11/4091; G11C 11/4094; G11C 5/147; G11C 11/4085; G11C 2207/005; G11C 17/16; G11C 17/18; G05F 1/465
See application file for complete search history.

(56) References Cited

U.S. PATENT DOCUMENTS

| | | | | |
|---|---|---|---|---|
| 2008/0079618 A1* | 4/2008 | Hino | ..................... | H03M 1/68 341/144 |
| 2009/0072804 A1* | 3/2009 | Hirota | ................... | G11C 17/16 323/280 |

* cited by examiner

*Primary Examiner* — David Lam
(74) *Attorney, Agent, or Firm* — Dorsey & Whitney LLP

(57) ABSTRACT

An apparatus is described. The apparatus according to an embodiment includes a voltage dividing resistor circuit formed on a semiconductor substrate and including first and second resistors and first and second selector switches. The first and second resistors and the first and second selector switches are arranged with one of first and second layouts. The first layout is such that the first and second selector switches are placed between the first and second resistors. The second layout is such that the first and second resistors are placed between the first and second selector switches.

17 Claims, 12 Drawing Sheets

APPARATUSES AND METHODS FOR INTERNAL VOLTAGE GENERATING CIRCUITS

BACKGROUND

High data reliability, high speed of memory access, low power consumption, and reduced chip size are features that are demanded from semiconductor memory. In recent years, there has been an effort to increase access speed and precision while reducing power consumption for semiconductor memory devices. In some examples, because of the reduced chip sizes and the low power consumption, there may be a wider variation of circuit component size within the chip, which may result in a greater number of internal voltages used within the chip. As a result of more internal voltages, a greater number of internal voltage generator circuits may be included on the chip to provide the internal voltages. However, increasing a number of internal voltage generator circuits requires additional area on the chip, which reduces availability for other circuitry. It may be desirable to provide internal voltage generator circuits that use less area on the chip

DETAILED DESCRIPTION OF PREFERRED EMBODIMENTS

Figure 1:
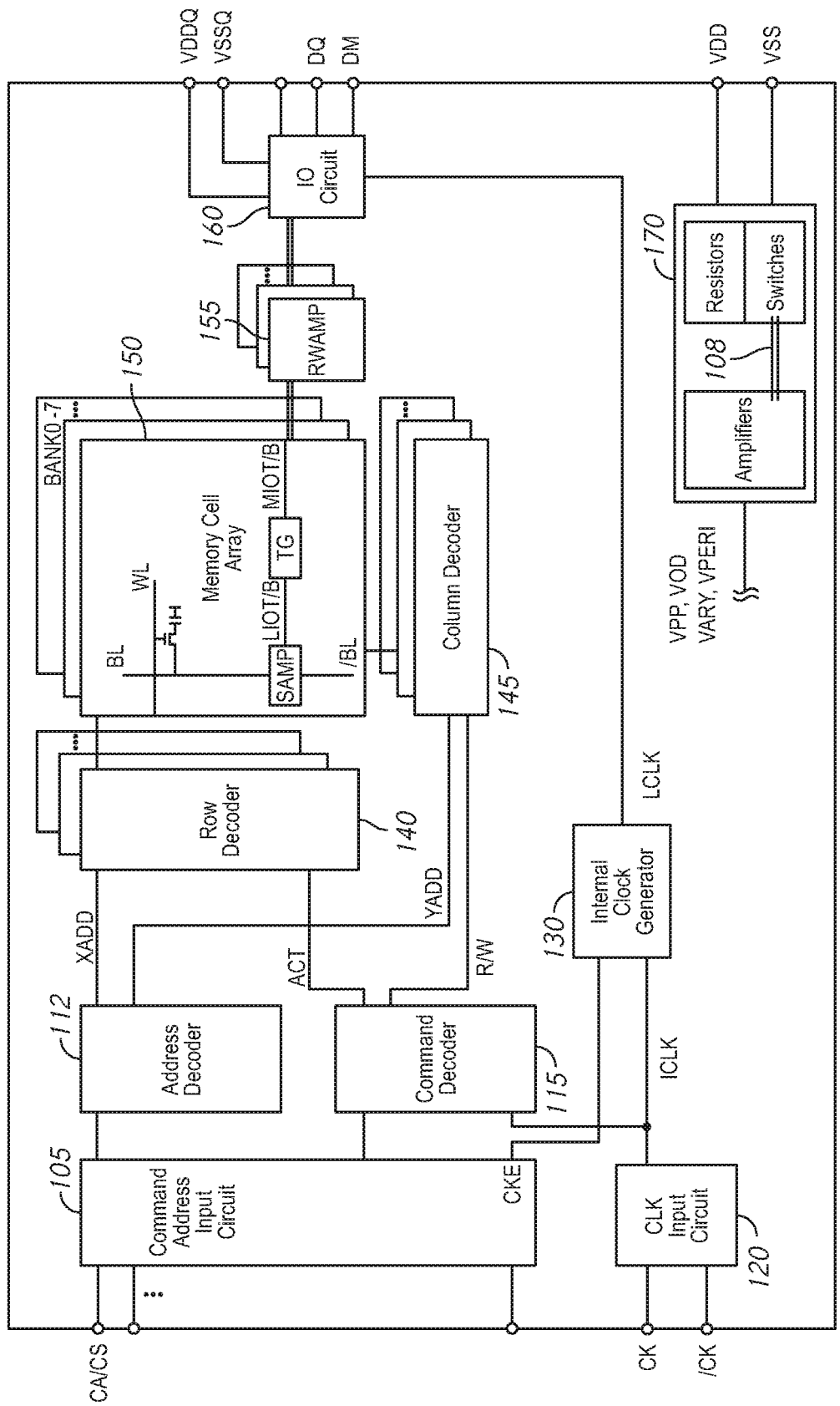
FIG. 1 is a block diagram of an apparatus according to an embodiment of the disclosure.

Certain details are set forth below to provide a sufficient understanding of embodiments of the disclosure. However, it will be clear to one having skill in the art that embodiments of the disclosure may be practiced without these particular details. Moreover, the particular embodiments of the disclosure described herein should not be construed to limit the scope of the disclosure to these particular embodiments. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components. The term "overlap" of two components may refer to the two components having a geometrical relationship so that the two components share a common plane between them, and the common plane forms an overlapped area. For example, wiring tracks may overlap resistors to form an overlapped area between the wiring tracks and the resistors. The terms "placed" and "disposed" for a component may refer to the component being physically placed or disposed so that the component is physically oriented in relation to other components. For example, resistors may be physically placed/disposed to surround, or to be between, selector switches (e.g., transfer gates).

Memory devices generally may include any electronic device that holds data. The memory device may be a memory inside an integrated circuit, a storage device or any electronic device that has a memory or storage, such as a direct memory access (DMA)-compliant memory, double data rate (DDR) memory, a hardware management system, an accelerator, or a co-processor, etc. For example, the memory device may be a semiconductor memory device (e.g., low power DDR dynamic random-access memory (DRAM) (LPDDR) device). The memory device may also be a portable memory device such as a non-transitory storage medium, a mobile phone. The memory device may also be a computing platform having memory thereon. The memory devices described herein may solve the problems described herein via a coherent shared memory device that leverages various memory types that may be coupled with one another via a reconfigurable fabric that includes configurable logic blocks.

Memory devices including semiconductor devices DRAM or the like are capable of storing data in a plurality of memory cells. The memory devices have reduced chip size, increased speed to support high speed operations, and decreased power consumption. The reduction of power consumption is achieved by dividing the power supply potential of the source and back bias. However, as a result of the divided power supply potential of the source and back bias, the kinds of power supply voltages tend to increase, with the result that the number of circuits for controlling the voltage levels in conventional memory devices tends to increase.

The internal voltage generators may be utilized to generate internal reference voltages (e.g., ZQ reference voltage) based on power supply potentials. Some internal voltage generators may include a voltage dividing resistor circuit having resistors utilized to generate the reference voltages. The voltage dividing resistor circuit may be of a type through which current generally flows, in some examples.

Because the kinds of power supply voltages tends to increase and because a size of voltage dividing circuits of some internal voltage generators tends to increase accordingly, it becomes important to reduce the layouts of those circuits. Resistors having high resistance values may be utilized in some internal voltage generator circuits to decrease current flow and reduce an amount of space required for placement of the resistors. The voltage dividing resistors in some memory devices may include the high resistance values applied thereto so as to decrease current flow.

Some memory devices may include N− resistors in the voltage dividing resistor circuit, which have a larger resistance value and lower current flow. The semiconductor chip with N− resistors requires a larger number of processes during production. The larger number of processes required for the semiconductor chip using the N− resistors may increase production costs of the semiconductor chip.

Some memory devices may also include metal-oxide semiconductor (MOS) transistors coupled to voltage dividing resistors for On/Off control to decrease current flow. The MOS transistors may be added to the voltage dividing resistor circuit to control the output in the conventional memory devices. A large amount of time may be required to turn On the MOS transistors responsive to an enable signal to output a current, due to the large resistance value of the voltage dividing resistors. Due to demands for high precision, a number of pullouts from the respective resistor intersections of the voltage dividing resistor circuit tends to increase. The MOS transistors in some memory devices are provided separate from the voltage dividing resistors. Due to the resistors and selectors being provided in the divided manner, the operation of the conventional internal voltage generator may be influenced by peripheral wiring noise. The resistors provided separate from the selectors in the divided manner result in wiring tracks being required for shielding.

The memory devices using MOS transistors may include a large amount of higher order wiring regions or layers (e.g., metal2 regions) coupled from pullouts of the resistor intersections to pullouts of selector switches. Congestion of the metal2 regions may interrupt other wirings passing over the layout, thereby causing a problem of not being able to effectively place the other circuit components. The congestion of the metal2 regions may apply pressure to the metal2 regions caused by pullouts from the resistor intersections to the selector switches. The metal may be unable to be plugged within the metal2 region such as to allow LOGIC/CA-DQ exchanged on the layout to be transmitted. Wiring pulled out from the resistor intersections in the voltage dividing resistor circuit may provide a signal for use in determining a reference voltage. Reducing influence of noise on the signal provided by the voltage dividing resistor circuit to may increase reliability of the reference voltage. Thus, in some examples, limiting signals transmitted in other metal regions or layers may be implemented.

The memory devices using MOS transistors may result in deviations in wiring capacity and resistance ("CR") due to distance differences caused from the pullouts from the resistor intersection in the voltage dividing resistor circuit. The CR in the longest portion of the circuit may determine a time of circuit operation. Adjustments in a circuit on a succeeding stage or another circuit may be implemented to meet a desired an operation margin.

In accordance with the examples described herein, a memory device may include resistors having a smaller resistance value disposed together with MOS transistors selectively activated for providing a voltage to a plurality of amplifiers outputting internal reference voltages. The resistors and the selector switches may be grouped together to reduce the size of the internal voltage generator and decrease high order wirings. The resistors disposed together with the MOS transistors in the voltage dividing resistor circuit may be N+ resistors. Although the N+ resistors have a lower sheet resistance and take up a larger amount of space, the N+ resistors may be fabricated using fewer processes during production, which may result in lower production costs. The N+ resistors having the smaller resistance decreases the time required for turning On the MOS transistors. The shorter amount of time required by the N+ resistors for turning on the selector switches coupled to the N+ resistors in the voltage dividing resistor circuit enables an output current to be improved to provide higher power efficiency.

In accordance with the examples described herein, the resistors and the selector switches in the memory device may be grouped together to be placed in a same region of a layout. Grouping the resistors and selector switches together may decrease a number of extraneous regions having dummy resistors and requires a smaller amount of space, as compared with other implementations. In some examples, the voltage dividing resistor circuits may be wired without a high order hierarchy such that shielding may be installed to prevent noise from influencing other circuits.

In the examples described herein, the memory device may include resistors of the voltage dividing circuit provided to surround the selectors. The selectors of the memory device may be disposed between the resistors. The semiconductor chip having the selectors disposed between the resistors has various advantages, including eliminating influences received from noise, reducing a size of the layout, and reducing a number of wiring tracks.

In some embodiments, the resistors may be disposed between the selector switches to provide connections between the resistors and the selector switches. Pullout passages from contacts of the resistors may be formed without using higher order wirings (e.g., metal2 wirings). Passages between contacts of the resistors and selector switches having deviations in respective resistor contacts in conventional voltage generator circuits can be properly aligned according to embodiments described herein. CR at resistor contacts may be aligned to the minimum. By aligning CR to the minimum, spare time is generated in circuit operations so that adjustments in the succeeding circuit can be easily carried out. As a result of the pullout passages from the contacts of the resistors not being formed with metal in a metal2 region, the metal2 region may be used for a noise countermeasure shield and passage wiring on a high order hierarchy. By using the metal2 region as a shield, noise countermeasures of resistor parts may be strengthened in comparison with the prior art. Moreover, signals in the metal3 layer are allowed to freely pass.

FIG. 1 is a block diagram of an apparatus according to an embodiment of the disclosure. An apparatus 100 may be a semiconductor device, and will be referred to as such. In some embodiments, the semiconductor device 100 may include, without limitation, a DRAM device, such as LPDDR memory integrated into a single semiconductor chip, for example. The semiconductor device 100 may include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) may be located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address and chip select (CA/CS) terminals coupled to a command and address bus to receive commands and addresses, and a CS signal, clock terminals to receive clocks CK and /CK, data terminals DQ and DM, and power supply terminals VDD, VSS, VDDQ, and VSSQ.

The CA/CS terminals may be supplied with memory addresses. The memory addresses supplied to the CA/CS terminals may be transferred, via a command/address input circuit 105, to an address decoder 112. The address decoder 112 receives the address and supplies a decoded row address XADD to the row decoder 140 and supplies a decoded column address YADD to the column decoder 145. The CA/CS terminals may be supplied with commands. The commands may be provided as internal command signals to a command decoder 115 via the command/address input circuit 105. The command decoder 115 includes circuits to decode the internal command signals to generate various internal signals and commands for performing operations. For example, the command decoder 115 may provide a row command signal ACT to select a word line and a column command signal R/W to select a bit line.

When a read command is received, and a row address and a column address may be timely supplied with the read command, read data is read from a memory cell in the memory array 150 designated by the row address and column address. The read command is received by the command decoder 115, which provides internal commands so that read data from the memory array 150 is output to outside from the data terminals DQ via the read write amplifiers 155 and the input/output circuit 160. When the write command is received, and a row address and a column address may be timely supplied with the write command, write data supplied to the data terminals DQ is written to a memory cells in the memory array 150 designated by the row address and column address. A data mask may be provided to the data terminals DM to mask portions of the data when written to memory. The write command is received by the command decoder 115, which provides internal commands so that the write data is received by data receivers in the input/output circuit 160, and supplied via the input/output circuit 160 and the read/write amplifiers 155 to the memory array 150.

The clock terminals CK and /CK may be supplied with external clocks that are provided to an input buffer 120. The external clocks may be complementary. The input buffer 120 generates an internal clock ICLK based on the CK and /CK clocks. The ICLK clock is provided to the command decoder 115 and to an internal clock generator 122. The internal clock generator 122 provides various internal clocks LCLK based on the ICLK clock. The LCLK clocks may be used for timing the operation of various internal circuits. For example, the clocks may be provided to the input/output circuit 160 for timing the operation of the input/output circuit 160 to provide and receive data on the data terminals DQ.

The power supply terminals VSS and VDD may be supplied with power supply potentials. These power supply potentials are supplied to an internal voltage generator circuit 170. The internal voltage generator circuit 170 generates various internal potentials VPP, VOD, VARY, VPERI, and the like based on the power supply potentials supplied to the power supply terminals VSS and VDD. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The internal voltage generator circuit 170 may include a plurality of amplifiers 102, a resistor 104, a plurality selector switches 106, and a plurality of wiring tracks 108. The resistor 104 and the selector switches 106 may form voltage divider circuits configured to provide the various internal potentials. The selector switches 106 may be disposed (e.g., placed) along with, and grouped together with, the resistor 104. The selector switches 106 may be at least partially encircled by the resistor 104, in some examples. Each of selector switches 106, for example, may include transfer gates between which a respective group of resistors among the resistor 104 is disposed.

The selector switches 106 may be coupled to the plurality of amplifiers 203 via the plurality of wiring tracks 108. Each of the resistor 104 may be, for example, an N+ resistor. The resistor 104 may be coupled to the selector switches 106 selectively controlled for generating reference voltages. For example, the various internal potentials VPP, VOD, VARY, VPERI, and the like are provided by the voltage dividing resistor circuit via the plurality of amplifiers 102 and via the plurality of wiring tracks 108.

The selector switches 106 in the internal voltage generator circuit 170 may provide an On/Off control for the internal voltage generator circuit 170 to reduce the output current. The internal voltage generator circuit 170 including N+ resistors instead of the N− resistors has a shorter time for turning on the selector switches 106 and has reduced power consumption.

The resistor 104 and the selector switches 106 may be placed together (e.g., disposed together, grouped together, physically integrated together, or co-located), and coupled to a plurality of amplifiers 102, via a plurality of wiring tracks 108 (e.g., two wiring tracks). By grouping resistors and selector switches together, an influence of peripheral wiring noise to the resistors and selector switches may be reduced. Because the resistors are placed together with the selector switches, a space occupied by the internal voltage generator circuit is smaller. An amount of peripheral wiring noise influencing the voltages generated by the internal voltage generator circuit becomes smaller. Because the wiring between the resistors and the selector switches is pulled from a wiring on a low-order hierarchy, noise influences from another wiring is received. A requirement for shielding for the wiring between the resistors and the selector switches is eliminated. A number of wiring tracks required for providing signals from the selector switches to the amplifiers may be smaller.

The power supply terminals VDDQ and VSSQ are also supplied with power supply potentials. The power supply potentials are supplied to the input/output circuit 160. The power supply potentials supplied to the power supply terminals VDDQ and VSSQ may be the same potentials as the power supply potentials supplied to the power supply terminals VDD and VSS in an embodiment of the disclosure. The power supply potentials supplied to the power supply terminals VDDQ and VSSQ may be different potentials from the power supply potentials supplied to the power supply terminals VDD and VSS in another embodiment of the disclosure. The power supply potentials supplied to the power supply terminals VDDQ and VSSQ are used for the input/output circuit 160 so that power supply noise generated by the input/output circuit 160 does not propagate to the other circuit blocks.

Figure 2:
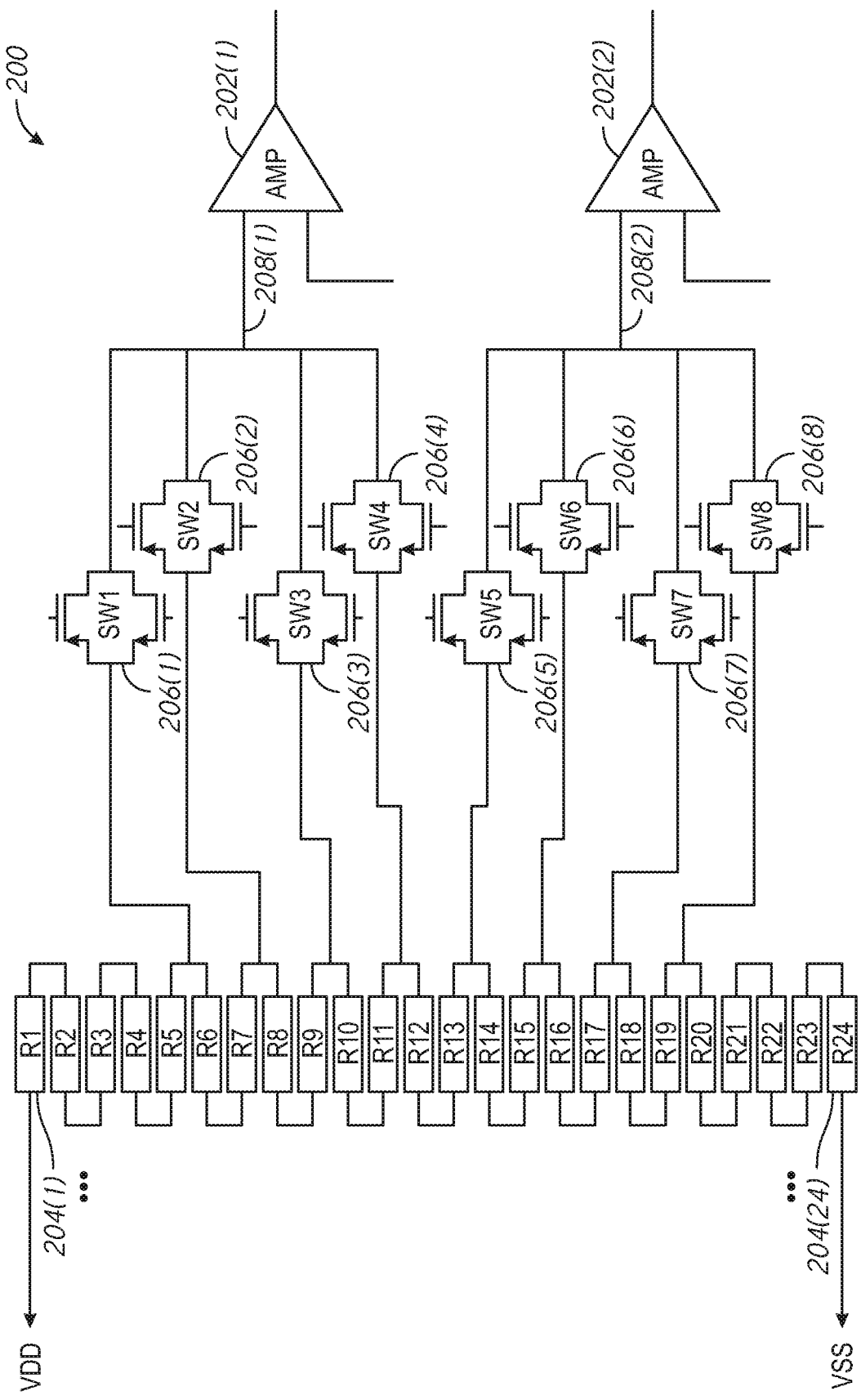
FIG. 2 is a circuit diagram of a voltage generator circuit including a voltage dividing resistor circuit according to an embodiment of the disclosure.

FIG. 2 is a circuit diagram of a voltage generator circuit including a voltage dividing resistor circuit according to an embodiment of the disclosure. A internal voltage generator circuit 200 may include amplifiers 202(1)-(2), resistors 204(1)-(24), selector switches 206(1)-(8), and wiring tracks 208(1)-(2). The amplifiers 102, the resistors 104, the selector switches 106, and/or the wiring tracks 108, respectively, of FIG. 1 may implement the amplifiers 202(1)-(2), the resistors 204(1)-(24), the selector switches 206(1)-(8), and/or the wiring tracks 208(1)-(2), respectively. The selector switches 206(1)-(8) may be grouped together with the resistors 204(1)-(24).

The resistors 204(1)-(24) may be serially-coupled between a power supply terminal VDD and a ground potential terminal VSS. The resistors 204(1)-(24) may be grouped into a first group of resistors 204(1)-(12) and a second group of resistors 204(13)-(24). The first group of resistors 204(1)-(12)) and the second group of resistors 204 204(13)-(24) may selectively provide two voltages at two levels to the amplifiers 202(1)-(2), respectively. Embodiments of the disclosure depicted in FIG. 2 are not limited to a depicted number of resistors, selector switches, amplifiers, and selectively provided voltages. More or fewer resistors, selector switches, amplifiers, and selectively provided voltages may be implemented without departing from the scope of the disclosure.

The selector switches 206(1)-(8) may be divided into two groups. For example, the selector switches 206 may include a first group of selector switches 206(1)-(4) and a second group of selector switches 206(5)-(8). Each of the selector switches 206(1)-(8) may include a respective PMOS transistor and an NMOS transistor. Source electrodes of the PMOS and NMOS transistors of each of the selector switches 206(1)-(8) may be coupled together, and further coupled to a node between two of the resistors 204(1)-(24). For example, source electrodes of the PMOS and NMOS transistors of the selector switch 206(1) may be coupled together, and further coupled to a node between resistors 204(5) and 204(6). Source electrodes of the PMOS and NMOS transistors of the selector switch 206(5) may be coupled together, and further coupled to a node between resistors 204(13) and 204(14). Drain electrodes of the PMOS and NMOS transistors of each of the first group of selector switches 206(1)-(4) may be coupled together and to the wiring track 208(1) and drain electrodes of the PMOS and NMOS transistors of each of the second group of selector switches 206(5)-(8) may be coupled together and to the wiring track 208(2). The wiring track 208(1) may be coupled to the amplifier 202(1) and the wiring track 208(2) may be coupled to the amplifier 202(2).

In operation, the first group of resistors 204(1)-(12) may provide a first voltage at a first level from a node coupled between resistors 204(5) and 204(6) to the amplifier 202(1) via the first group of selector switches 2060)-(4) and the wiring track 208(1). The second group of resistors 204(13)-(24) may provide a second voltage at a second level from a node coupled between resistors 204(13) and 204 (14) to the amplifier 202(2) via the second group of selector switches 206(5)-(8) and the wiring track 208(2).

To provide a first voltage to the amplifier 202(1), the first group of selector switches 206(1)-(4) may couple a node between two corresponding resistors among the first group of resistors 204(1)-(12) to the amplifier 202(1). In response, the amplifier 202(1) may provide a first output voltage based on the first voltage at an output. The first voltage may include one of four voltage levels based on which of the first group of selector switches 206(1)-(4) is enabled. To provide a second voltage to the amplifier 202(2), the second group of selector switches 206(5)-(8) may couple a node between two corresponding resistors among the second group of resistors 204(13)-(24) to the amplifier 202(2). In response, the amplifier 202(2) may provide a second output voltage based on the second voltage at an output. The second voltage may include one of four voltage levels based on which of the first group of selector switches 206(1)-(4) is enabled. In some examples, only one of the selector switches 206(1)-(8) may be enabled at a time. For example, when the selector switch 206(1) is enabled, the selector switches 206(2)-(8) may be disabled. In other examples, one of the first group of selector switches 206(1)-(4) and one of the second group of selector switches 206(5)-(8) may be contemporaneously enabled, with all other selector switches disabled.

Figure 3:
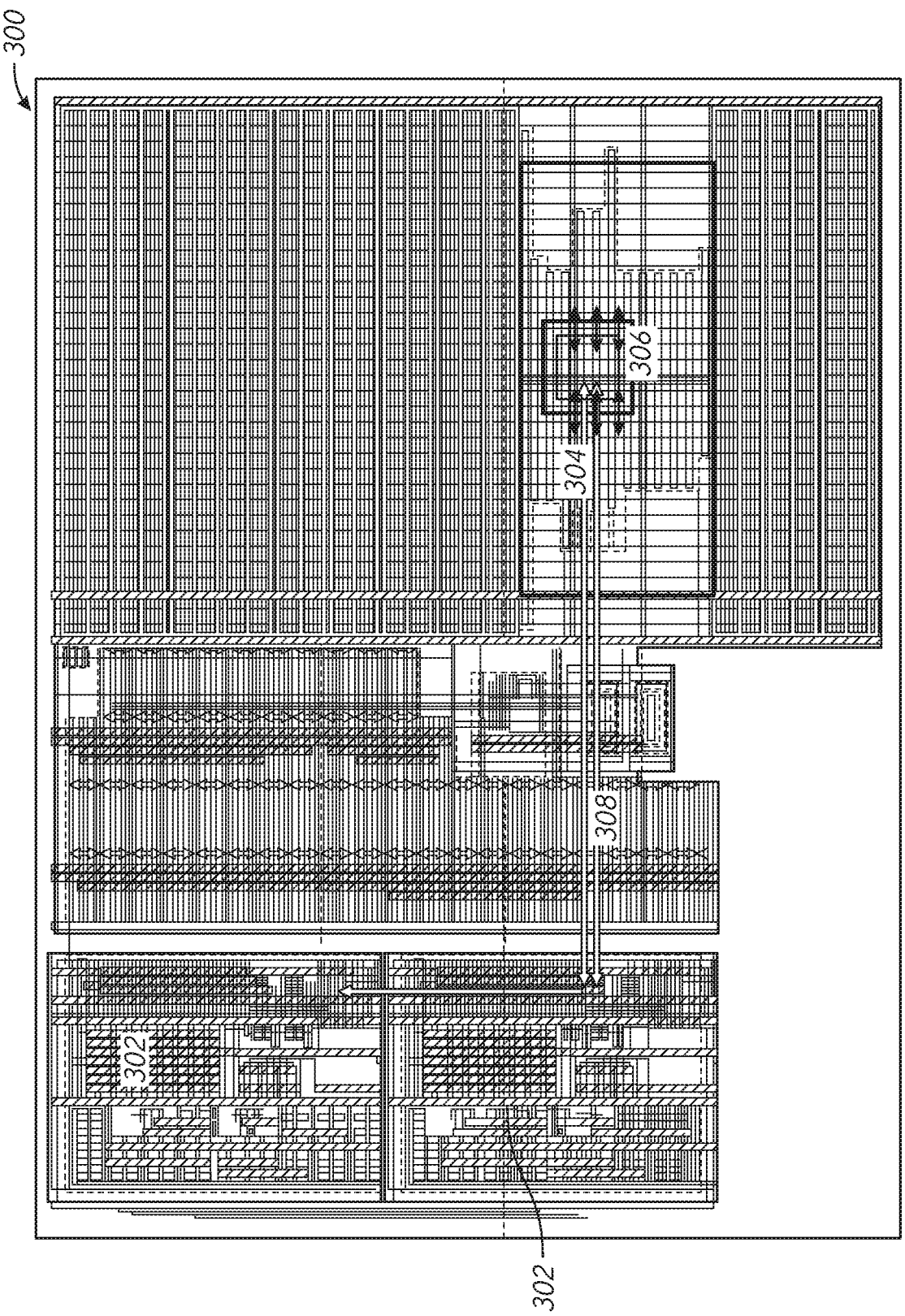
FIG. 3 is an exemplary layout diagram including a voltage generator circuit according to an embodiment of the disclosure.

FIG. 3 is an exemplary layout diagram including a voltage generator circuit according to an embodiment of the disclosure. A voltage generator circuit 300 may be included a semiconductor device such as a DRAM device capable of storing data in a plurality of memory cells. The internal voltage generator circuit 300 includes amplifiers 302, resistor 304, selector switches 306, and wiring tracks 308. The wiring tracks 308 may be, for example, two wiring tracks. The amplifiers 102, the resistors 104, the selector switches 106, and/or the wiring tracks 108, respectively, of FIG. 1 and/or the amplifiers 202(1)-(2), the resistors 204(1)-(24), the selector switches 206(1)-(8), and/or the wiring tracks 208(1)-(2), respectively, of FIG. 2 may implement the amplifiers 302, the resistors 304, the selector switches 306, and/or the wiring tracks 308.

The selector switches 306 are disposed (e.g., grouped) together with the resistors 304. For example, the selector switches 306 may be surrounded by (e.g., placed/disposed within or placed/disposed in a center of) the resistors 304. By placing the resistors 304 around the selector switches 306, the total space consumed may be reduced as compared with implementations that place the selector switches 306 adjacent to or separate from the resistors 304. In addition, noise that affects operation of the internal voltage generator circuit may be reduced.

Figure 4:
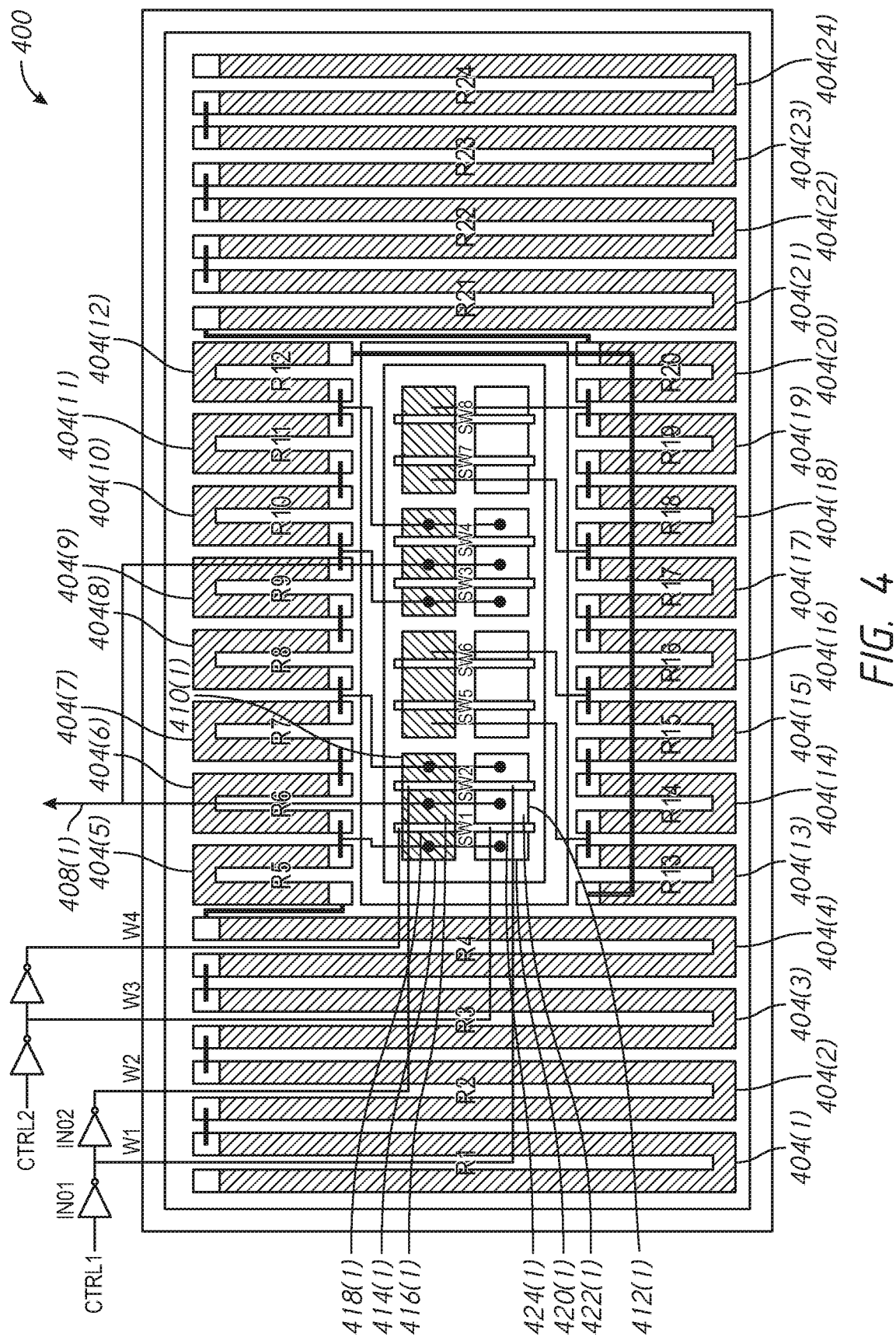
FIG. 4 is an exemplary layout diagram of a voltage dividing resistor circuit according to an embodiment of the disclosure.

FIG. 4 is an exemplary layout diagram of a voltage dividing resistor circuit according to an embodiment of the disclosure. A voltage dividing resistor circuit 400 may include resistors 404(1)-(24), selector switches SW1-SW8, and wiring track 408(1). The resistors 104, the selector switches 106, and/or the wiring tracks 108, respectively, of FIG. 1 and/or the resistors 204(1)-(24), the selector switches 206(1)-(8), and/or the wiring tracks 208(1)-(2), respectively, of FIG. 2 may implement the resistor 404(1)-(24), the selector switches SW1-SW8, and/or the wiring track 408(1), respectively. For clarity, the exemplary layout diagram shown in FIG. 4 has omitted some circuitry of the voltage dividing resistor circuit 400. It is appreciated that the additional circuitry may be included without departing from the scope of the disclosure. For example. FIG. 4 only depicts the wiring track 408(1) coupled to the selector switches SW1-SW4. It is appreciated than an additional wiring track may be implemented to be coupled to the selector switches SW5-SW8 in a similar manner. In addition, FIG. 4 only includes inverters INV1-INV4 that are configured to provide control signals to switches SW1 and SW2 via the wiring tracks W1-W4, respectively. It is appreciated than additional inverters and wiring tracks may be implemented to be coupled to the selector switches SW2-SW8 in a similar manner.

The resistor 404(1)-(24) may include a first group of resistors 404(1)-(12) resistors 404(1)-(12) and a second group of resistors 404(13)-(24) resistors 404(13)-(24). Each of the resistor 404(1)-(24) may be U-shaped with a first end and a second end being adjacent to one another and spaced apart. A length of resistors 404(1)-(4) may be the same as a length of resistors 404(21)-(24), in some examples. A length of resistors 404(5)-(12) may be the same as a length of resistors 404(13)-(20). Resistors 404(1)-(4) and (21)-(24) may extend from a first edge to a second edge of the voltage dividing resistor circuit 400. The resistors 404(5)-(12) may extend from a first edge of the selector switches SW1-SW8 to the second edge of the voltage dividing resistor circuit 400 and the resistors 404(13)-(20) may extend from a second edge of the selector switches SW1-SW8 to the first edge of the voltage dividing resistor circuit 400. In some examples, the resistors 404(1)-(4) and (21)-(24) may be longer than the resistors 404(5)-(20).

The resistors 404(1)-(24) may be coupled in series from resistor R1 to resistor R24. The resistors 404(1)-(24) may be coupled between a ground potential terminal VSS and a power supply terminal VDD, resistors R1 and R24 respectively coupled to the power supply terminal VDD and the ground potential terminal VSS. The resistors 404(1)-(12) may provide a first voltage at a first level to the wiring track 408(1); and the resistors 404(13)-(24) may provide a second voltage at a second level to a corresponding second wiring track (not shown).

Each of selector switches SW1-SW8 may include a PMOS transistor 410 and an NMOS transistor 412. Each PMOS transistor 410 may include a source electrode 414, a drain electrode 416, and a gate electrode 418. Each NMOS transistor 412 may include a source electrode 420, a drain electrode 422, and a gate electrode 424. Source electrodes of the PMOS and NMOS transistors of each of the selector switches SW1-SW8 may be coupled together, and further coupled to a node between two of the resistors 404(1)-(24). For example, the source electrodes 414(1) and 420(1) of the PMOS and NMOS transistors 410(1) and 412(1), respectively, may be coupled together, and further coupled to a node between resistors R5 and R6. Drain electrodes of the PMOS and NMOS transistors of at least one of the first group of selector switches SW1-SW8 may be coupled together and to the wiring track 408(1). For example, the drain electrodes 416(1) and 422(1) of PMOS and NMOS transistors 410(1) and 412(1), respectively, may be coupled together and further coupled via a wiring track 408(1) to a corresponding one of the amplifiers (not shown) (e.g., one of the amplifiers 202(1)-(2) of FIG. 2). The gate electrodes 418(1) and 424(1) of the PMOS and NMOS transistors 410(1) and 412(1), respectively, may be coupled to respective output nodes of inverters INV4-INV3, respectively. The inverters INV1-2 may provide control signals via the wires W1 and W2 to control the selector switch SW2 in response to control signal 1 CTRL1 and inverters INV3-4 may provide control signals via the wires W3 and W4 to control the selector switch SW1 in response to control signal 2 CTRL2. Similar controls for selector switches SW3-SW8 may be implemented.

The transistors of the selector switches SW1-SW8 may be coupled to the wiring track 408(1), including the PMOS transistors 410 and the NMOS transistors 412.

It will be appreciated the arrangement of the resistors 404(1)-(24), the PMOS and NMOS transistors 410 and 412, respectively, of the selector switches SW1-SW8, and the wiring track 408(1), as illustrated in FIG. 4, is provided by way of example and is not intended to limit the scope of the disclosure to the particular embodiment. In other embodiments of the disclosure, other circuit layouts may be implemented without departing from the scope of the disclosure.

Figure 5:
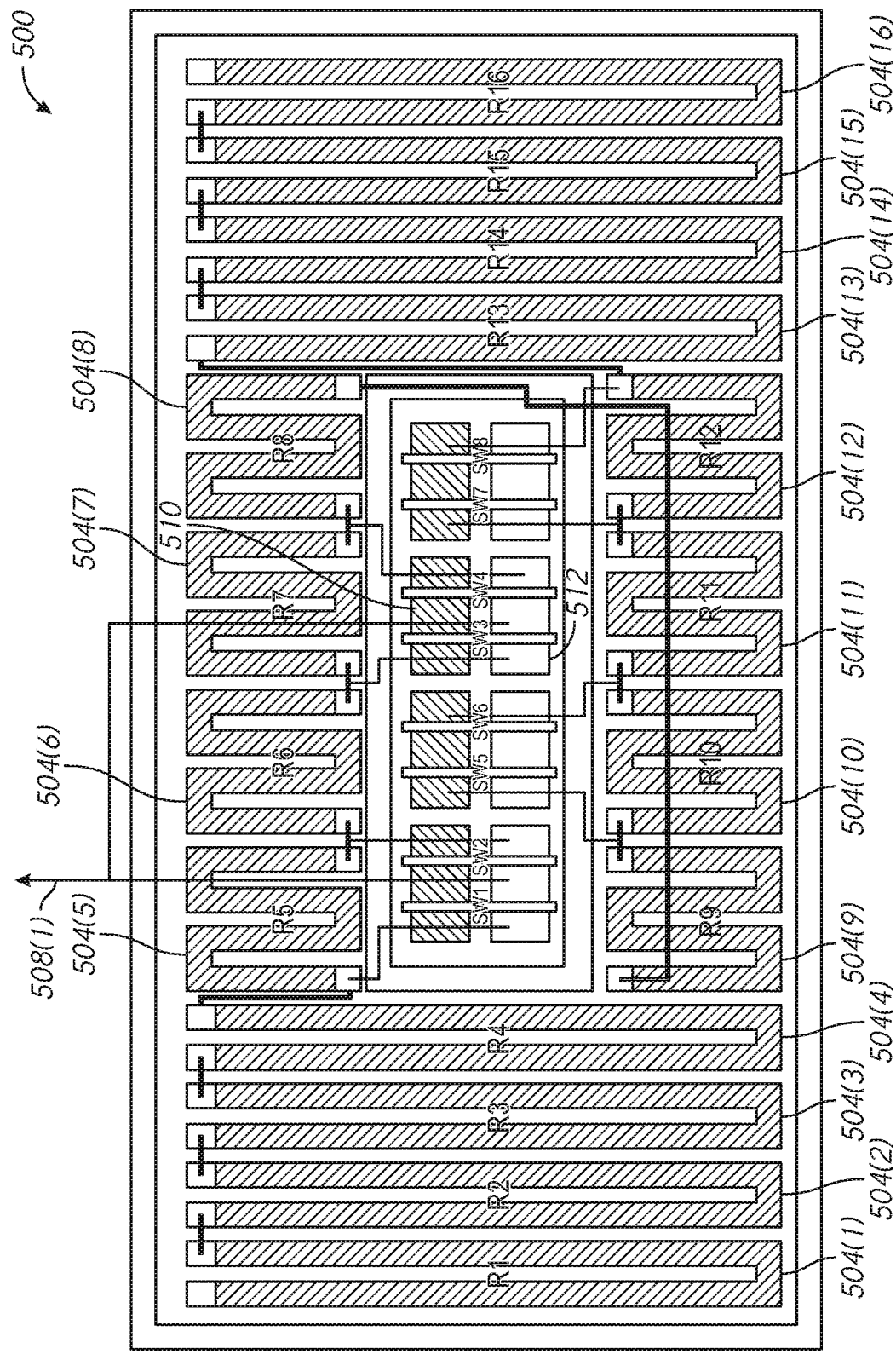
FIG. 5 is an exemplary layout diagram of a voltage dividing resistor circuit according to an embodiment of the disclosure.

FIG. 5 is an exemplary layout diagram of a voltage dividing resistor circuit according to an embodiment of the disclosure. A voltage dividing resistor circuit 500 may include resistors 504(1)-(16), selector switches SW1-SW8, and a wiring track 508(1). The resistors 104, the selector switches 106, and/or the wiring tracks 108, respectively, of FIG. 1 and/or the resistors 204(1)-(24), the selector switches 206(1)-(8), and/or the wiring tracks 208(1)-(2), respectively, of FIG. 2 may implement the resistors 504(1)-(16), the selector switches SW1-SW8, and the wiring track 508(1), respectively. The voltage dividing resistor circuit 500 may include elements that have been previously described with respect to the voltage dividing resistor circuit 400 of FIG. 4. Those elements have been identified in FIG. 5 using reference numbers corresponding to the reference numbers used in FIG. 4 and operation of the common elements is as previously described. Consequently, a detailed description of the operation of these particular elements will not be repeated in the interest of brevity.

Each of the selector switches SW1-SW8 may include a PMOS transistor 510 and an NMOS transistor 512. The PMOS transistor 510(1) may include a source electrode 514(1), a drain electrode 516(1), and a gate electrode 518(1). The NMOS transistor 512(1) may include a source electrode 520(1), a drain electrode 522(1), and a gate electrode 524(1).

The resistors 504(1)-(16) may include a first group of resistors 504(1)-(8) and a second group of resistors 504(9)-(16). The first group of resistors 504(1)-(8) may be implemented a first group of resistors, similar to the first group of resistors 404(1)-(12) of FIG. 4, except with single resistors 504(5)-(8) replacing a respective pair of the resistors 404(5)-(12). That is, each of the resistors 504(5)-(8) may have a length twice as long as each of the resistors 404(5)-(12) of FIG. 44. The second group of resistors 504(9)-(16)) may be implemented as the second group of resistors 404(13)-(24) of FIG. 4, except with single resistors 504(9)-(12) replacing a respective pair of the resistors 404(13)-(20). Each of the resistors 504(9)-(16) may have a length twice as long as each of the resistors 404(13)-(20) of FIG. 4. The selector switches SW1-SW8 may be controlled substantially the same as the selector switches SW1-SW8 of FIG. 4.

Figure 6:
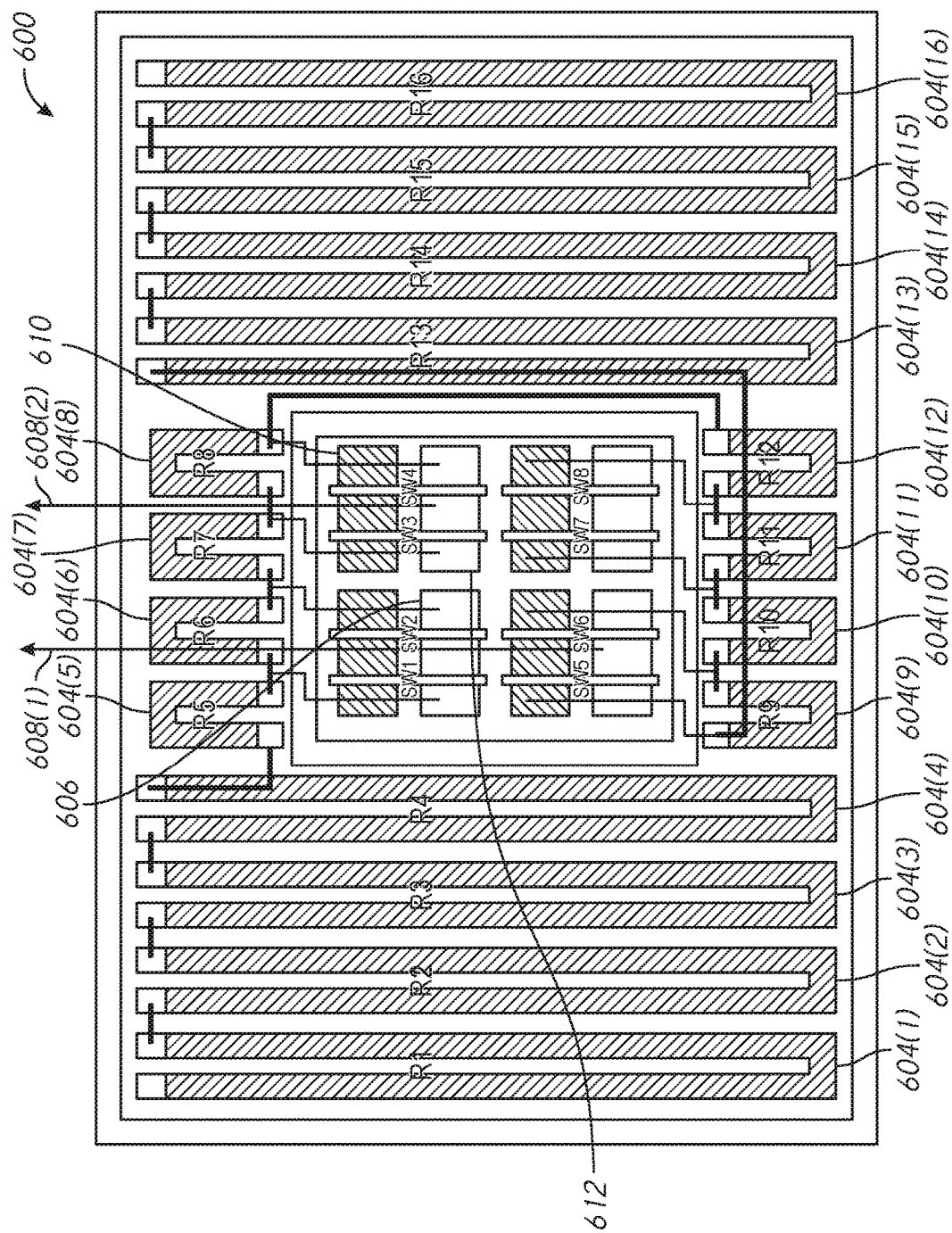
FIG. 6 is an exemplary layout diagram of a voltage dividing resistor circuit according to an embodiment of the disclosure.

FIG. 6 is an exemplary layout diagram of a voltage dividing resistor circuit according to an embodiment of the disclosure. A voltage dividing resistor circuit 600 may include resistors 604(1)-(16), selector switches SW1-SW8, and a wiring track 608(1). The resistors 104, the selector switches 106, and/or the wiring tracks 108, respectively, of FIG. 1 and/or the resistors 204(1)-(24), the selector switches 206(1)-(8), and/or the wiring tracks 208(1)-(2), respectively, of FIG. 2 may implement the resistors 604(1)-(16), the selector switches SW1-SW8, and the wiring track 608(1), respectively. The voltage dividing resistor circuit 600 may include elements that have been previously described with respect to the voltage dividing resistor circuit 400 of FIG. 4. Those elements have been identified in FIG. 6 using reference numbers corresponding to the reference numbers used in FIG. 4 and operation of the common elements is as previously described. Consequently, a detailed description of the operation of these particular elements will not be repeated in the interest of brevity.

The resistors 604(1)-(16) may include a first group of resistors 604(1)-(8) and a second group of resistors 604(9)-(16). The first group of resistors 604(1)-(8) may be implemented, respectively, as a first group of resistors, similar to the first group of resistors 504(1)-(8) of FIG. 5, except with resistors 604(5)-(8) replacing the resistors 504(5)-(8) of FIG. 5. The second group of resistors 604(9)-(16) may be implemented, respectively, as a second group of resistors, similar to the second group of resistors 504(9)-(16) of FIG. 5, except with resistors 604(9)-(13) replacing the resistors 504(9)-(13) of FIG. 5, in some examples, each of the resistors 604(5)-(12) may have a length half as long as each of the resistors 504(5)-(12) of FIG. 5. A physical arrangement of the selector switches SW1-SW8 may be implemented as the selector switches SW11-SW8 of FIGS. 4 and 5, except rather than being arranged in a single row, the selector switches SW1-SW8 of FIG. 6 are arranged in two separate rows, with a first row having selector switches SW1-SW4 and a second row having the selector switches SW5-SW8.

Figure 7:
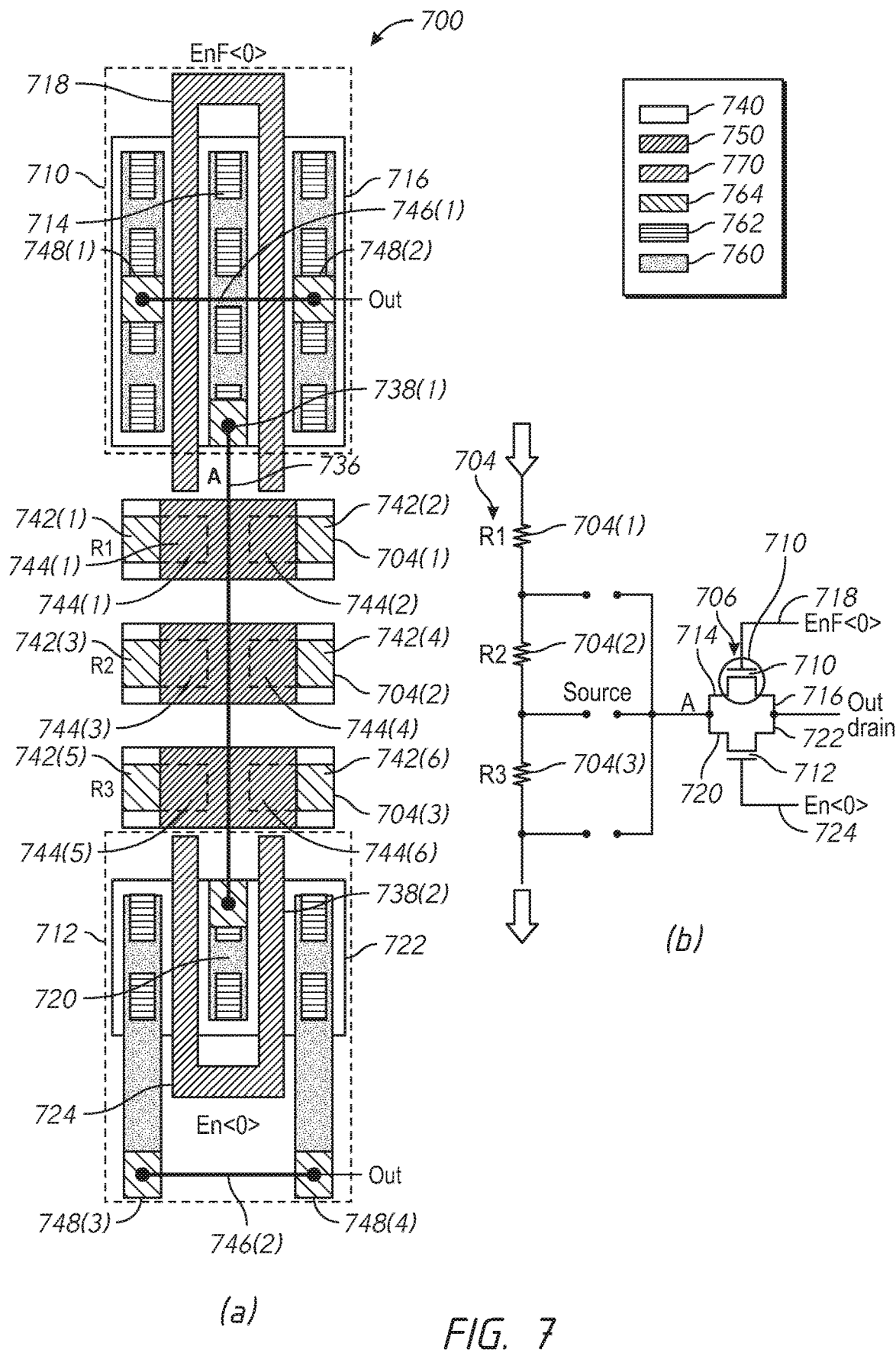
FIG. 7 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 7 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of a voltage dividing resistor circuit 700 includes a selector switch 706. The selector switch 706 is coupled to resistors 704(1)-(3) and a wiring track. Any of the resistors 104 and/or the selector switches 106, respectively, of FIG. 1 and/or any of the resistors 204(1)-(24) and/or the selector switches 206(1)-(8), respectively, of FIG. 2 may implement the selector switch 706 and/or the resistors 704(1)-(3).

The selector switch 706 may include a PMOS transistor 710 and an NMOS transistor 712. The PMOS transistor 710 and the NMOS transistor 712 in the selector switch 706 may be disposed (e.g., placed) to be grouped together with, the resistors 704(1)-(3). The resistors 704(1)-(3) may be disposed to be parallel to each other, and may be each disposed in a first direction (e.g., each of the resistors 704(1)-(3) may be disposed along a first axis). First and second ends of the resistors 704(1)-(3) may be aligned, respectively, in a second direction (e.g., left and right ends of the resistors 704(1)-(3) may be aligned, respectively, along a second axis).

The PMOS transistor 710 may include a source electrode 714, a drain electrode 716, and a gate electrode 718. The NMOS transistor 712 may include a source electrode 720, a drain electrode 722, and a gate electrode 724. The gate electrode 718 in the PMOS transistor 710 may be coupled to an active-low enable signal EnF<0>. The gate electrode 724 in the NMOS transistors 712 may be coupled to an active-high enable signal En<0>).

The selector switch 706 may include metal1 layer segments 746(1) and (2) and contacts 748(1)-(4) and a metal1 layer segment 736 and contacts 738(1) and (2).

The PMOS transistor 710 may be disposed on a first side of the resistors 704(1)-(3) and the NMOS transistor 712 may be disposed on a second side of the resistors 704(1)-(3) opposite the first side such that the resistors 704(1)-(3) may be disposed between the PMOS transistor 710 and the NMOS transistor 712. The resistor 704(1) may be disposed between the PMOS transistor 710 and the resistor 704(2), the resistor 704(2) may be disposed between the resistor 704(1) and the resistor 704(3), and the resistor 704(3) may be disposed between the resistor 704(2) and the NMOS transistor 712.

The gate electrode 718 may be folded in a U shape disposed between portions of the drain electrode 716. That is, the drain electrode 716 may include two portions each of which is adjacent to an outside surface of the gate electrode 718. The contacts 748(1)-(2) may be disposed on each of the two portions of the drain electrode 716 on the outside surface of the gate electrode 718. The gate electrode 718 may be disposed on each of two sides of the source electrode 714. That is, the source electrode 714 may be disposed on adjacent to inside surfaces of the gate electrode 718. The contact 738(1) may be disposed on the source electrode 714.

The gate electrode 724 may be folded to have a U shape disposed between portions of the drain electrode 722(1). That is, the drain electrode 722 may include two portions each of which is adjacent to outside surface of the gate electrode 724(1). The contacts 748(3) and (4) may be disposed on each of the two portions of the drain electrode 722. The gate electrode 724 may be disposed on each of two sides of the source electrode 720. That is, the source electrode 720 may be disposed adjacent to inside surfaces of the gate electrode 724. The contact 738(2) may be disposed on the source electrode 720.

The source electrode 714 and the source electrode 720 may be coupled together via the metal1 layer segment 736 and the contacts 738(1) and (2), respectively. The two portions of each of the drain electrode 716 may be coupled to together via the metal1 layer segment 746(1) and the contacts 748(1) and (2). The two portions of each of the drain electrode 722 may be coupled to together via the metal1 layer segment 746(2) and the contacts 748(3) and (4).

Each of the gate electrodes 718 and 724 may be implemented by using a gate layer 770. Each of the source electrodes 714 and 720 may be implemented by using a metal0 layer 760 and by using contacts 762 for a peripheral circuit disposed at the metal0 layer 760. Each of the drain electrodes 716 and 722 may be implemented by using the metal0 layer 760 and by using contacts 762 for a peripheral circuit disposed at the metal0 layer 760. The contacts 742(1)-(6) may be disposed by using contacts 764 at portions of the metal0 layer 760, respectively, at ends of the resistor 704(1)-(3).

Each of the resistors 704(1)-(3) may be implemented by using a metal0 resistor layer 750. The resistors 704(1)-(3) may further include metal0 layer 740, respective ones of contacts 742(1)-(6), and respective ones of potential metal1 layer segment regions 744(1)-(6). The potential metal1 layer segment regions 744(1)-(6) may each be used as pullout positions of resistor contacts 742(1)-(6) that may be altered by altering a metal1 connection between two of the resistors 704(1)-(3). A shape of the pullout corresponding to a respective one of the potential metal1 layer segment regions 744(1)-(6) may be set to substantially a same shape and size as any of the plurality of contacts 742(1)-(6). Embodiments of the disclosure are not limited to the shape and size of the pullout. The resistors 704(1)-(3) may be coupled to a plurality of contacts 742(1)-(6), via the metal0 layer 740 and via respective ones of the potential metal1 layer segment 744(1)-(6).

A single column of the voltage dividing resistor circuit 700 includes the selector switch 706 and the resistors 706(1)-(3). Additional columns may be included and combined in various ways to create the voltage dividing resistor 700 that are able to provide more than one different voltage.

Figure 8:
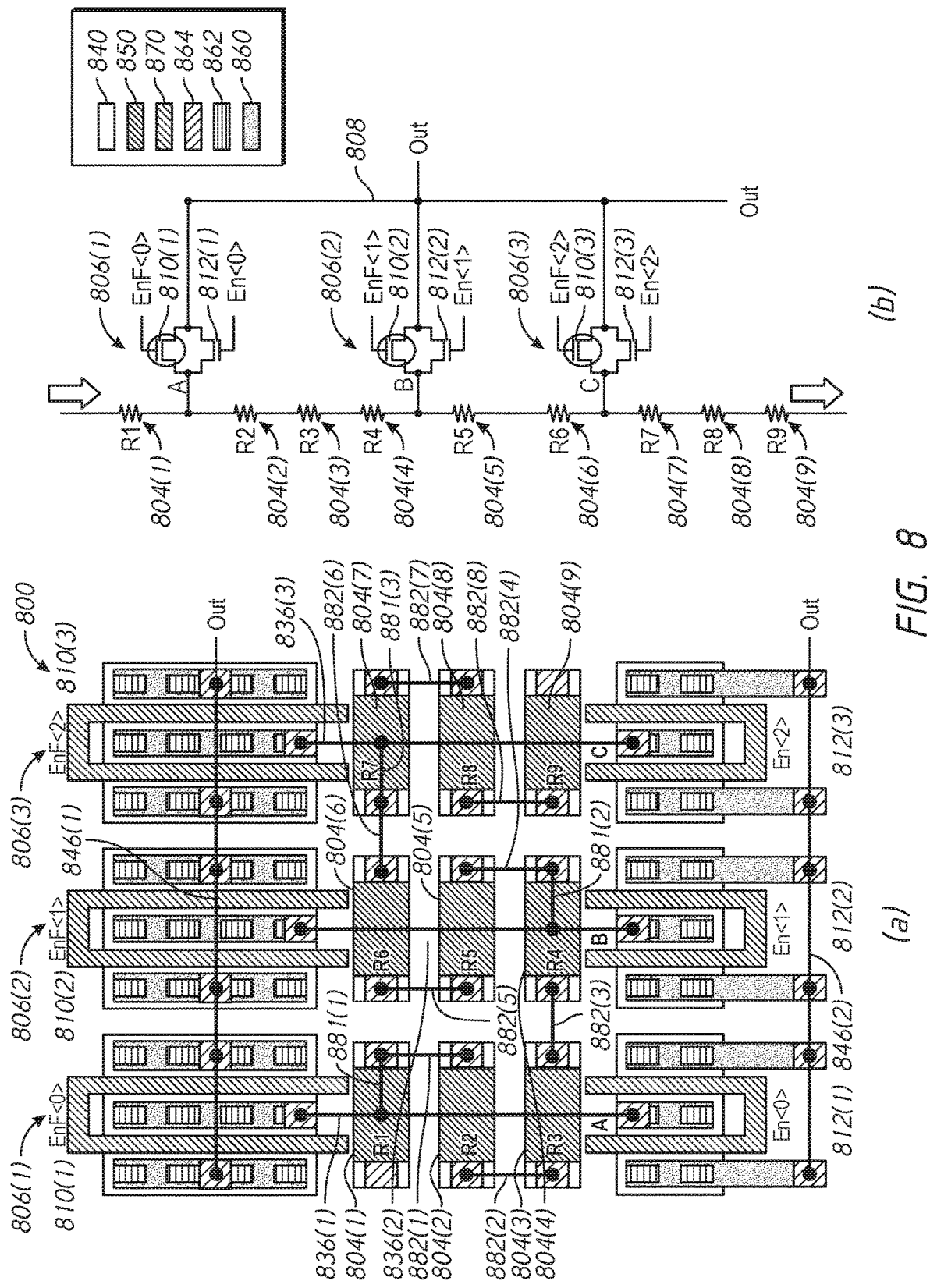
FIG. 8 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 8 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of a voltage dividing resistor circuit 800 includes selector switches 806(1)-(3) in three columns, respectively. The selector switches 806(1)-(3) may be coupled to resistors 804(1)-(9), and a wiring track 808. Any of the resistors 104 and/or the selector switches 106, respectively, of FIG. 1 and/or any of the resistors 204(1)-(24) and/or the selector switches 206(1)-(8), respectively, of FIG. 2 may implement the selector switches 806(1)-(3) and/or the resistors 804(1)-(9). The voltage dividing resistor circuit of FIG. 8 may include elements that have been previously described with respect to the voltage dividing resistor circuit of FIG. 7. Those elements have been identified in FIG. 8 using reference numbers corresponding to the reference numbers used in FIG. 7 and operation of the common elements is as previously described. Consequently, a detailed description of the operation of these particular elements will not be repeated in the interest of brevity.

Each of the selector switches 806(1)-(3) may include, for example, a respective PMOS transistor 810(1)-(3) and a respective NMOS transistor 812(1)-(3). The selector switches 806(1)-(3) may be controlled by the respective En<0:2> and EnF<0:2> signals. Each of the selector switches 806(1)-(3) may include a respective metal1 layer segment 836(1)-(3) configured to connect the source of respective PMOS transistor 810(1)-(3) to source of the respective NMOS transistor 812(1)-(3). The drains of the PMOS transistors 810(1)-(3) may be coupled together via a metal1 layer segment 846(1) and drains of the NMOS transistors 812(1)-(3) may be coupled together via a metal1 layer segment 846(2).

The resistors 804(1)-(9) may be serially coupled together via metal1 layer segments 882(1)-(8) in a daisy-chain arrangement. The respective metal1 layer segment 836(1)-(3) may be coupled to a node between a respective pair of the resistors via the respective metal1 layer segment 881(1)-(3). For example, the selector switch 804(1) may be coupled between the resistors 804(1) and 804(2) via the respective metal1 layer segment 881(1). The selector switch 806(2) may be coupled between the resistors 804(4) and 804(5) via the respective metal1 layer segment 881(2). The selector switch 806(3) may be coupled between the resistors 804(6) and 804(7) via the respective metal1 layer segment 881(3).

As shown in the arrangement depicted in the exemplary layout diagram 800, the selector switches 806(1)-(3) may be grouped together with the resistors 804(1)-(9), with the resistors 804(1)-(9) disposed between the PMOS transistors 810(1)-(3) and the NMOS transistors 812(1)-(3). While the layout diagram 800 of FIG. 8 depicts three selector switches 806(1)-(3) paired with three respective resistors 804(1)-(9), it would be appreciated that more or fewer selector switches may be included and each selector switch may be paired with more or fewer than three resistors. Additionally, for clarity, the metal1 layer segment 836(1)-(3), the metal1 layer segment 846(1)-(2), the metal1 layer segment 881(1)-(3), and the metal1 layer segment 882(1)-(8) are all depicted using a line. It is appreciated that the metal1 layer segment 836(1)-(3), the metal1 layer segment 846(1)-(2), the metal1 layer segment 881(1)-(3), and the metal1 layer segment 882(1)-(8) may be constructed to have a width similar to widths of other layers depicted in the exemplary layout diagram 800, such as a width similar to the respective contacts to which the metal1 layer segment connect, in some examples. In some examples, the resistance of each of the resistors 804(1)-(9) may be based on a combination of a material of the metal0 resistor layer 750, a length of the metal0 resistor layer 750 between a respective pair of contacts (e.g., between a respective pair of the contacts 742(1)-(6) of FIG. 7), and/or a width of the metal0 resistor layer 750. In some examples, increasing a length or decreasing a width may increase respective resistance of the resistors 804(1)-(9) and decreasing a length or increasing a width may decrease respective resistance of the resistors 804(1)-(9). It is appreciated that the metal1 layer segment 836(1)-(3), the metal1 layer segment 846(1)-(2), the metal1 layer segment 881(1)-(3), and the metal1 layer segment 882(1)-(8) may be formed in a common layer and/or from a common material, in some examples.

Figure 9:
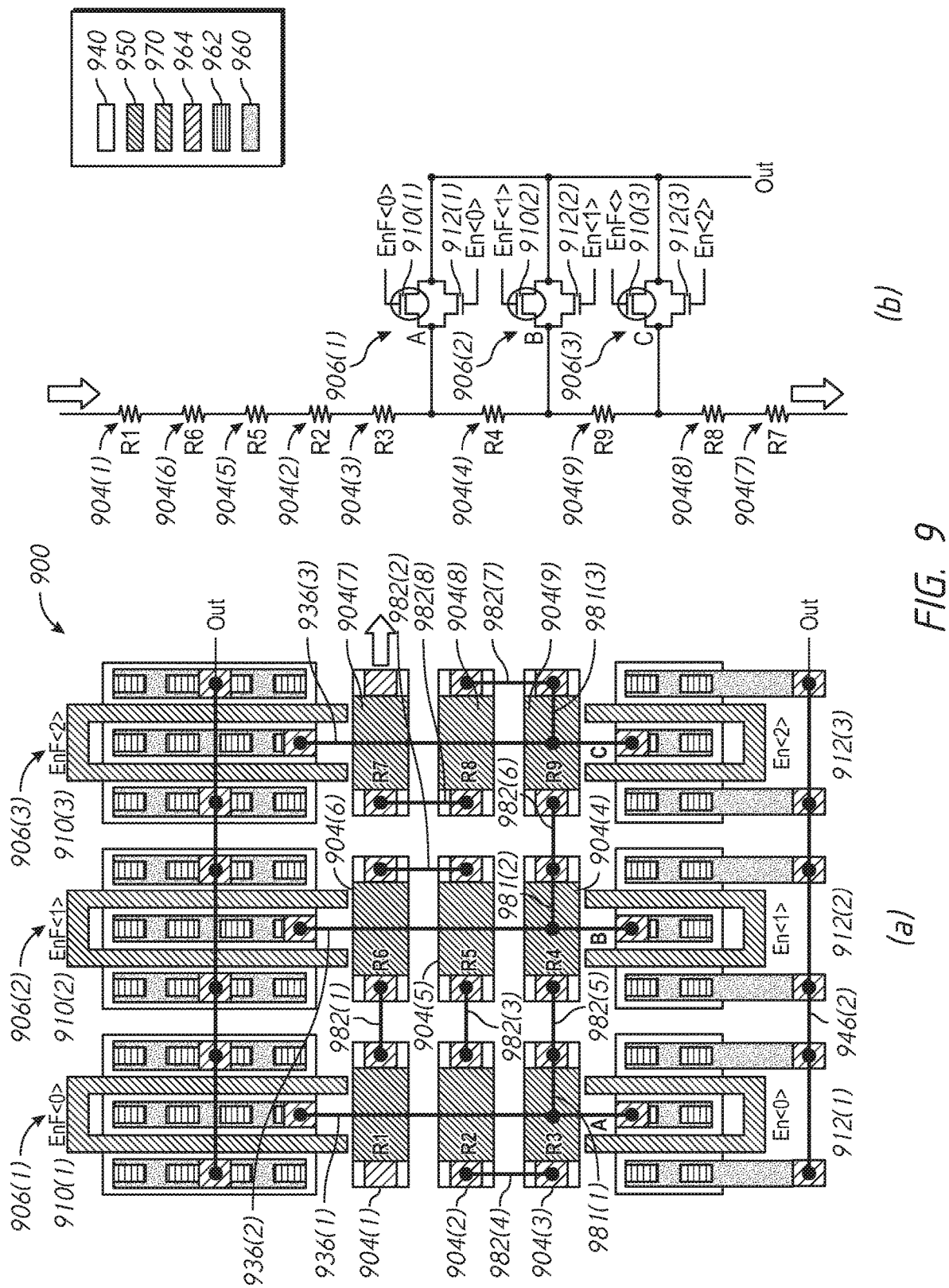
FIG. 9 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 9 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of a voltage dividing resistor circuit 900 includes selector switches 906(1)-(3). The selector switches 906(1)-(3) may be coupled to resistors 904(1)-(9), and a wiring track 808. The voltage dividing resistor circuit of FIG. 9 may include elements that have been previously described with respect to the voltage dividing resistor circuits of FIGS. 7 and 8. Those elements have been identified in FIG. 9 using reference numbers corresponding to the reference numbers used in FIGS. 7 and 8 and operation of the common elements is as previously described. Consequently, a detailed description of the operation of these particular elements will not be repeated in the interest of brevity.

The portion of the voltage dividing resistor circuit 900 includes metal1 layer segments 982(1)-(8) and resistors 904(1)-(9). The metal1 layer segments 982(1)-(8) serially connect the resistors 904(1)-(9) in a different pattern than the metal1 layer segments 882(1)-(8) of FIG. 8. That is, rather than serially connecting the resistors 904(1)-(9) of a column before moving to resistors of an adjacent column, the metal1 layer segments 982(1)-(8) connect resistors across columns. For example, the resistor 904(1) is connected to the resistor 904(6) via the metal1 layer segment 982(1). The resistor 904(6) is connected to the resistor 904(5) via the metal1 layer segment 982(2). The resistor 904(5) is connected to the resistor 904(2) via the metal1 layer segment 982(3). The resistor 904(2) is connected to the resistor 904(3) via the metal1 layer segment 982(4). The resistor 904(3) is connected to the resistor 904(4) via the metal1 layer segment 982(5). The resistor 904(4) is connected to the resistor 904(9) via the metal1 layer segment 982(6). The resistor 904(9) is connected to the resistor 904(8) via the metal1 layer segment 982(7). The resistor 904(8) is connected to the resistor 904(7) via the metal1 layer segment 982(8).

In addition to the connection pattern of the resistors 904(1)-(9) of FIG. 9 being different than the connection pattern of the resistors 804(1)-(9), the exemplary layout diagram in (a) in FIG. 9 and the corresponding exemplary circuit diagram in (b) in FIG. 9 of the voltage dividing resistor circuit 900 also depict the selector switches 906(1)-(3) coupled to different respective nodes among the resistors via the metal1 layer segments 981(1)-(3). For example, the selector switch 906(1) is connected to a node between the resistors 904(3) and 904(4) via the metal1 layer segment 981(1), which is between fifth and sixth resistors of the resistors 904(1)-(9) based on the connection pattern of the metal1 layer segments 982(1)-(8), rather than between a first and second resistor as depicted in FIG. 8. The selector switch 906(2) is connected to a node between the resistors 904(4) and 904(9) via the metal1 layer segment 981(2), which is between a sixth and seventh resistor of the resistors 904(1)-(9) based on the connection pattern of the metal1 layer segments 982(1)-(8). Lastly, the selector switch 906(3) is connected to a node between the resistors 904(8) and 904(9) via the metal1 layer segment 981(3), which is between a seventh and eighth resistor of the resistors 904 (1)-(9) For clarity, the metal1 layer segments 936(1)-(3), the metal1 layer segments 946(1)-(2), the metal1 layer segments 981(1)-(3), and the metal1 layer segments 982(1)-(8) are all depicted using a line. It is appreciated that the metal1 layer segments 936(1)-(3), the metal1 layer segments 946(1)-(2), the metal1 layer segments 981(1)-(3), and the metal1 layer segments 982(1)-(8) may be constructed to have a width similar to widths of other layers depicted in the exemplary layout diagram 800, such as a width similar to the respective contacts to which the metal1 layer segment connect, in some examples.

Figure 10:
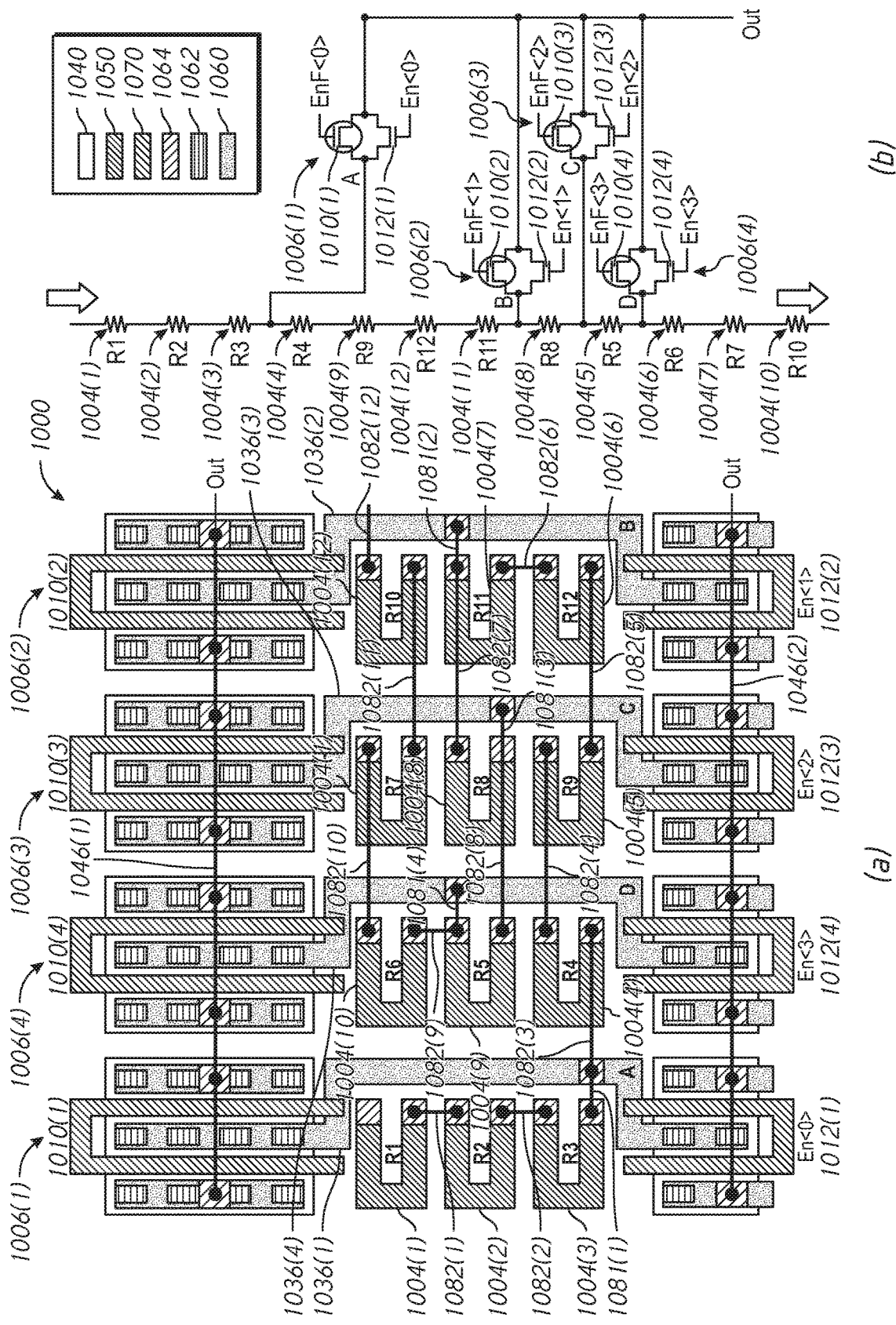
FIG. 10 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 10 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of the voltage dividing resistor circuit 1000 includes selector switches 1006(1)-(4). The selector switches 1006(1)-(4) may be coupled to resistors 1004(1)-(12), and a wiring track 1008. Any of the resistors 104 and/or the selector switches 106, respectively, of FIG. 1 and/or any of the resistors 204(1)-(24) and/or the selector switches 206(1)-(8), respectively, of FIG. 2 may implement the selector switches 1006(1)-(4) and/or the resistors 1004 (1)-(12). The voltage dividing resistor circuit of FIG. 10 may include elements that have been previously described with respect to the voltage dividing resistor circuit of FIG. 7. Those elements have been identified in FIG. 10 using reference numbers corresponding to the reference numbers used in FIG. 7 and operation of the common elements is as previously described. Consequently, a detailed description of the operation of these particular elements will not be repeated in the interest of brevity.

Each of the selector switches 1006(1)-(4) may include, for example, a respective PMOS transistor 1010(1)-(4) and a respective NMOS transistor 1012(1)-(4). The selector switches 1006(1)-(4) may be controlled by the respective En<0:2> and EnF<0:2> signals. Each of the selector switches 1006(1)-(4) may include a respective metal1 layer segment 1036(1)-(4) configured to connect the source of respective PMOS transistor 1010(1)-(4) to source of the respective NMOS transistor 1012(1)-(4). Also, as shown in the exemplary layout diagram 1000, the metal1 layer segments 1036(1)-(4) may have a non-linear structure that includes bends and other shapes. The drains of the PMOS transistors 1010(1)-(4) may be coupled together via a metal1 layer segment 1046(1) and drains of the NMOS transistors 1012(1)-(4) may be coupled together via a metal1 layer segment 1046(2).

The resistors 1004(1)-(12) may be serially coupled together via metal1 layer segments 1082(1)-(12) in a daisy-chain arrangement. The respective metal1 layer segments 1036(1)-(4) may be coupled to a node between a respective pair of the resistors via the respective metal1 layer segments 1081(1)-(4). For example, the selector switch 1006(1) may be coupled between the resistors 1004(3) and 1004(4) via the respective metal1 layer segment 1081(1). The selector switch 1006(2) may be coupled between the resistors 1004 (8) and 1004(11) via the respective metal1 layer segment 1081(2). The selector switch 1004(3) may be coupled between the resistors 1004(5) and 1004(8) via the respective metal1 layer segment 1081(3). The selector switch 1006(4) may be coupled between the resistors 1004(5) and 1004(6) via the respective metal1 layer segment 1081(4).

As shown in the arrangement depicted in the exemplary layout diagram 1000, the selector switches 1006(1)-(4) may be grouped together with the resistors 1004(1)-(12) disposed between the PMOS transistors 1010(1)-(4) and the NMOS transistors 1012(1)-(4). While the layout diagram 1000 of FIG. 10 depicts four selector switches 1006(1)-(4) paired with three respective resistors 1004(1)-(12), it would be appreciated that more or fewer selector switches may be included and each selector switch may be paired with more or fewer than three resistors. Additionally, for clarity, the metal1 layer segments 1036(1)-(4), the metal1 layer segments 1046(1)-(2), the metal1 layer segments 1081(1)-(4), and the metal1 layer segments 1082(1)-(12) are all depicted using a line. It is appreciated that the metal1 layer segments 1036(1)-(4), the metal1 layer segments 1046(1)-(2), the metal1 layer segments 1081(1)-(4), and the metal1 layer segments 1082(1)-(12) may be constructed to have a width similar to widths of other layers depicted in the exemplary layout diagram 1000, such as a width similar to the respective contacts to which the metal1 layer segments connect, in some examples. In some examples, the resistance of each of the resistors 1004(1)-(12) may be based on a combination of a material of the metal1 resistor layer 1050, a length of the metal0 resistor layer 1050 between a respective pair of contacts (e.g., between a respective pair of the contacts 742(1)-(6) of FIG. 7), and/or a width of the metal0 resistor layer 1050. In some examples, increasing a length or decreasing a width may increase respective resistance of the resistors 1004(1)-(12) and decreasing a length or increasing a width may decrease respective resistance of the resistors 1004(1)-(12). For example, as compared with the resistors 804(1)-(9) of FIGS. 8 and 9 being disposed having a linear pattern, the resistors 1004(1)-(12) are disposed having a U-shaped pattern. The length between respective contacts of the resistors 1004(1)-(12) having the U-shaped pattern may be greater than a length of the resistors 804(1)-(9) having the linear pattern. It is appreciated that the metal1 layer segments 1036(1)-(4), the metal1 layer segments 1046(1)-(2), the metal1 layer segments 1081(1)-(4), and the metal1 layer segments 1082(1)-(12) may be formed in a common layer and/or from a common material, in some examples.

Figure 11:
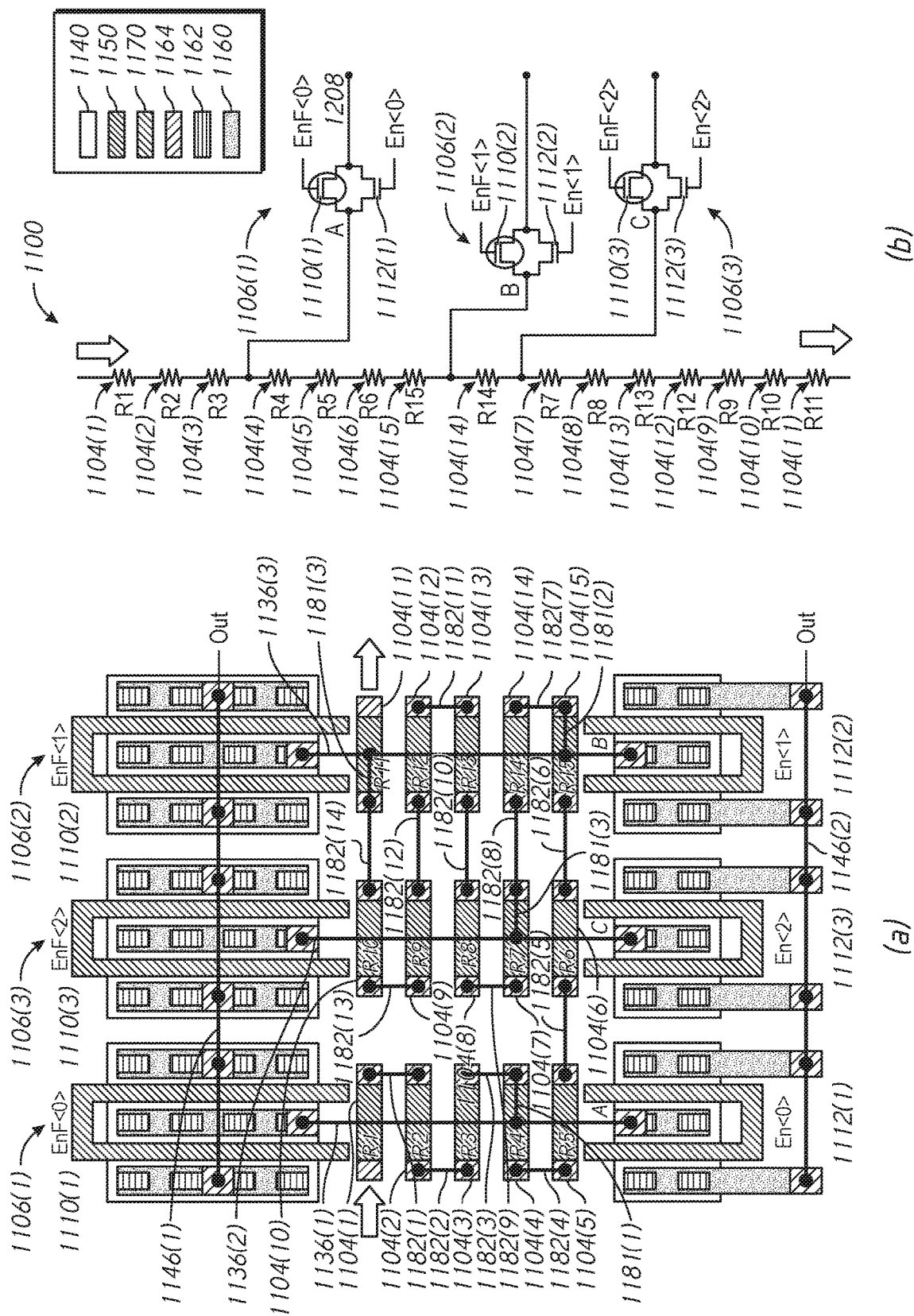
FIG. 11 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 11 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of a voltage dividing resistor circuit 1100 includes selector switches 1106(1)-(3). The selector switches 1106(1)-(3) may be coupled to resistors 1104(1)-(15), and a wiring track 1108. Any of the resistors 104 and/or the selector switches 106, respectively, of FIG. 1 and/or any of the resistors 204(1)-(24) and/or the selector switches 206(1)-(8), respectively, of FIG. 2 may implement the selector switches 1106(1)-(3) and/or the resistors 1104 (1)-(15). The voltage dividing resistor circuit of FIG. 11 may include elements that have been previously described with respect to the voltage dividing resistor circuit of FIGS. 7 and 8. Those elements have been identified in FIG. 11 using reference numbers corresponding to the reference numbers used in FIGS. 7 and 8 and operation of the common elements is as previously described. Consequently, a detailed description of the operation of these particular elements will not be repeated in the interest of brevity.

Each of the selector switches 1106(1)-(3) may include, for example, a respective PMOS transistor 1110(1)-(3) and a respective NMOS transistor 1112(1)-(3). The selector switches 1106(1)-(3) may be controlled by the respective En<0:2> and EnF<0:2> signals. Each of the selector switches 1106(1)-(3) may include a respective metal1 layer segment 1136(1)-(3) configured to connect the source of respective PMOS transistor 1110(1)-(3) to source of the respective NMOS transistor 1112(1)-(3). The drains of the PMOS transistors 1110(1)-(3) may be coupled together via a metal1 layer segment 1146(1) and drains of the NMOS transistors 1112(1)-(3) may be coupled together via a metal1 layer segment 1146(2).

The resistors 1104(1)-(15) may be serially coupled together via metal1 layer segments 1182(1)-(14) in a daisy-chain arrangement. The respective metal1 layer segment 1136(1)-(3) may be coupled to a node between a respective pair of the resistors via the respective metal1 layer segment 1181(1)-(3). For example, the selector switch 1104(1) may be coupled between the resistors 1104(3) and 1104(4) via the respective metal1 layer segment 1181(1). The selector switch 1104(2) may be coupled between the resistors 1104 (14) and 1104(15) via the respective metal1 layer segment 1181(2). The selector switch 1104(3) may be coupled between the resistors 1104(7) and 1104(14) via the respective metal1 layer segment 1181(3).

As shown in the arrangement depicted in the exemplary layout diagram 1100, the selector switches 1106(1)-(3) may be grouped together with the resistors 1104(1)-(15) disposed between the PMOS transistors 1110(1)-(3) and the NMOS transistors 1112(1)-(3). While the layout diagram 1100 of FIG. 11 depicts three selector switches 1106(1)-(3) paired with five respective resistors 1104(1)-(15), it would be appreciated that more or fewer selector switches may be included and each selector switch may be paired with more or fewer than five resistors. For example, as compared with the exemplary layout diagram 800 of FIG. 8 having three resistors between each selector switch, the exemplary layout diagram 1100 includes 5 resistors. Additionally, for clarity, the metal1 layer segments 1136(1)-(3), the metal1 layer segments 1146(1)-(2), the metal1 layer segments 1181(1)-(3), and the metal1 layer segments 1182(1)-(14) are all depicted using a line. It is appreciated that the metal1 layer segments 1136(1)-(3), the metal1 layer segments 1146(1)-(2), the metal1 layer segments 1181(1)-(3), and the metal1 layer segments 1182(1)-(14) may be constructed to have a width similar to widths of other layers depicted in the exemplary layout diagram 1100, such as a width similar to the respective contacts to which the metal1 layer segment connect, in some examples. In some examples, the resistance of each of the resistors 1104(1)-(15) may be based on a combination of a material of the metal0 resistor layer 750, a length of the metal0 resistor layer 750 between a respective pair of contacts (e.g., such as between a respective pair of contacts similar to the contacts 742(1)-(6) of FIG. 7), and/or a width of the metal0 resistor layer 750. In some examples, increasing a length or decreasing a width may increase respective resistance of the resistors 1104(1)-(15) and decreasing a length or increasing a width may decrease respective resistance of the resistors 1104(1)-(15). It is appreciated that the metal1 layer segments 1136(1)-(3), the metal1 layer segments 1146(1)-(2), the metal1 layer segments 1181(1)-(3), and the metal1 layer segments 1182(1)- (14) may be formed in a common layer and/or from a common material, in some examples.

Figure 12:
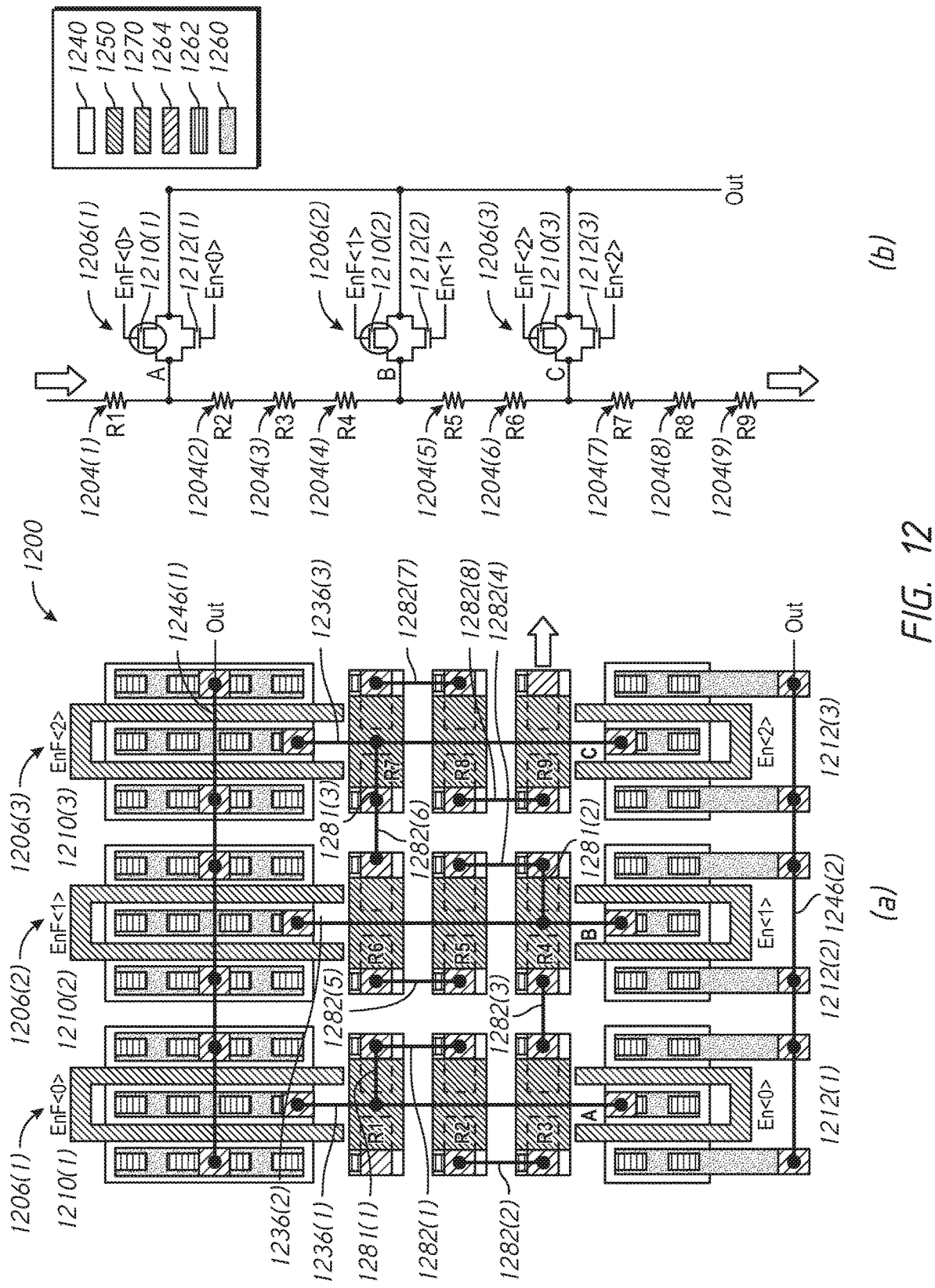
FIG. 12 in (a) is an exemplary layout diagram of a portion of a voltage dividing resistor circuit, and in (b) is a corresponding exemplary circuit diagram of the portion of the voltage dividing resistor circuit according to an embodiment of the disclosure.

FIG. 12 in (a) is an exemplary layout diagram of a portion of a voltage dividing resistor circuit, and in (b) is a corresponding exemplary circuit diagram of the portion of the voltage dividing resistor circuit according to an embodiment of the disclosure. A portion of a voltage dividing resistor circuit 1200 includes selector switches 1206(1)-(3). The selector switches 1206(1)-(3) may be coupled to resistors 1204(1)-(9), and a wiring track 808. Any of the resistors 104 and/or the selector switches 106, respectively, of FIG. 1 and/or any of the resistors 204(1)-(24) and/or the selector switches 206(1)-(8), respectively, of FIG. 2 may implement the selector switches 1206(1)-(3) and/or the resistors 1204 (1)-(9). The voltage dividing resistor circuit of FIG. 12 may include elements that have been previously described with respect to the voltage dividing resistor circuit of FIGS. 7 and 8. Those elements have been identified in FIG. 12 using reference numbers corresponding to the reference numbers used in FIGS. 7 and 8 and operation of the common elements is as previously described. Consequently, a detailed description of the operation of these particular elements will not be repeated in the interest of brevity.

Each of the selector switches 1206(1)-(3) may include, for example, a respective PMOS transistor 1210(1)-(3) and a respective NMOS transistor 1212(1)-(3). The selector switches 1206(1)-(3) may be controlled by the respective En<0:2> and EnF<0:2> signals. Each of the selector switches 1206(1)-(3) may include a respective metal1 layer segment 1236(1)-(3) configured to connect the source of respective PMOS transistor 1210(1)-(3) to source of the respective NMOS transistor 1212(1)-(3). The drains of the PMOS transistors 1210(1)-(3) may be coupled together via a metal1 layer segment 1246(1) and drains of the NMOS transistors 1212(1)-(3) may be coupled together via a metal1 layer segment 1246(2).

Rather than being constructed as the metal0 resistor layer 750 material as depicted and described with reference to the resistors 804(1)-(9) of FIG. 8, the resistors 904(1)-(9) of FIG. 9, the resistors 1004(1)-(12) of FIG. 10, and the resistors 1104(1)-(15) of FIG. 11, the resistors 1204(1)-(9) may be constructed using the gate layer 770 material. Similar effects may be realized using the gate layer 770 material as compared with using the metal0 resistor layer 750 material. The resistors 1204(1)-(9) may be serially coupled together via metal1 layer segments 1282(1)-(8) in a daisy-chain arrangement. The respective metal1 layer segment 1236(1)-(3) may be coupled to a node between a respective pair of the resistors via the respective metal1 layer segment 1281(1)-(3). For example, the selector switch 1204(1) may be coupled between the resistors 1204(1) and 1204(2) via the respective metal1 layer segment 1281(1). The selector switch 1204(2) may be coupled between the resistors 1204(4) and 1204(5) via the respective metal1 layer segment 1281(2). The selector switch 1204(3) may be coupled between the resistors 1204(6) and 1204(7) via the respective metal1 layer segment 1281(3).

As shown in the arrangement depicted in the exemplary layout diagram 1200, the selector switches 1206(1)-(3) may be grouped together with the resistors 1204(1)-(9), with the resistors 1204(1)-(9) disposed between the PMOS transistors 1210(1)-(3) and the NMOS transistors 1212(1)-(3). While the layout diagram 1200 of FIG. 12 depicts three selector switches 1206(1)-(3) paired with three respective resistors 1204(1)-(9), it would be appreciated that more or fewer selector switches may be included and each selector switch may be paired with more or fewer than three resistors. Additionally, for clarity, the metal1 layer segment 1236(1)-(3), the metal1 layer segment 1246(1)-(2), the metal1 layer segment 1281(1)-(3), and the metal1 layer segment 1282(1)-(8) are all depicted using a line. It is appreciated that the metal1 layer segment 1236(1)-(3), the metal1 layer segment 1246(1)-(2), the metal1 layer segment 12121(1)-(3), and the metal1 layer segment 1282(1)-(8) may be constructed to have a width similar to widths of other layers depicted in the exemplary layout diagram 1200, such as a width similar to the respective contacts to which the metal1 layer segment connect, in some examples. In some examples, the resistance of each of the resistors 1204(1)-(9) may be based on a combination of a material of the gate layer 770, a length of the gate layer 770 between a respective pair of contacts (e.g., between a respective pair of the contacts 742(1)-(6) of FIG. 7), and/or a width of the gate layer 770. In some examples, increasing a length or decreasing a width may increase respective resistance of the resistors 1204(1)-(9) and decreasing a length or increasing a width may decrease respective resistance of the resistors 1204(1)-(9). It is appreciated that the metal1 layer segment 1236(1)-(3), the metal1 layer segment 1246(1)-(2), the metal1 layer segment 1281(1)-(3), and the metal1 layer segment **1282(*l*)-(8)** may be formed in a common layer and/or from a common material, in some examples.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
   a voltage generator circuit including:
   a plurality of serially-coupled resistors disposed in a first region;
   a plurality of selector switches disposed in the first region and each coupled to a respective node between a pair of the plurality of serially-coupled resistors, wherein each of the plurality of selector switches is configured to be selectively, activated to provide a respective voltage from the respective node, wherein the plurality of selector switches are surrounded by the plurality of resistors disposed in the first region; and
   an amplifier coupled to the plurality of selector switches and configured to receive the respective voltage from the plurality of serially-coupled resistors.

2. The apparatus of claim 1, wherein the amplifier is disposed in a second region different from the first region.

3. The apparatus of claim 1, wherein the voltage generator circuit further comprises a wiring track, wherein the wiring track is configured to couple the plurality selector switches to the amplifier to provide the at least one voltage to an input of the amplifier.

4. An apparatus comprising:
   a voltage generator circuit including:
   a plurality of serially-coupled resistors disposed in a first region;
   a plurality of selector switches disposed in the first region and each coupled to a respective node between a pair of the plurality of serially-coupled resistors, wherein each of the plurality of selector switches is configured to be selectively activated to provide a respective voltage from the respective node and wherein each of the plurality of selector switches includes a respective PMOS and NMOS transistor pair; and
   an amplifier coupled to the plurality of selector switches and configured to receive the respective voltage from the plurality of serially-coupled resistors,
   wherein a first and a second resistor of the plurality of serially coupled resistors are disposed between the respective PMOS and NMOS transistor pair of a respective one of the plurality of selector switches.

5. The apparatus of claim 4, wherein a PMOS transistor of the respective PMOS and NMOS transistor pair of the respective one of the plurality of selector switches is positioned nearer to the amplifier than the NMOS transistor of the respective PMOS and NMOS transistor pair of the respective one of the plurality of selector switches.

6. The apparatus of claim 4, wherein the plurality of resistors includes a group of resistors extending in a first direction in parallel with one another and are aligned with one other in a second direction perpendicular to the first direction.

7. The apparatus of claim 6, wherein each resistor of the group of resistors includes a respective metal region configured to provide at least one pullout of at least one contact of a plurality of contacts disposed adjacent to the respective metal regions.

8. The apparatus of claim 7, wherein the plurality of resistors are coupled to the plurality of selector switches using common layer metal.

9. A voltage generator circuit comprising:
   a plurality of resistors;
   an amplifier;
   a wiring track coupled to the amplifier; and
   a plurality of selector switches integrated with the plurality of resistors and coupled to the wiring track, wherein one of the plurality of selector switches is configured to be enabled to provide respective voltage to the amplifier via the wiring track while remaining selector switches of the plurality of selector switches remain disabled, wherein the plurality of resistors surround the plurality of selector switches.

10. A voltage generator circuit comprising:
    a plurality of resistors;
    an amplifier;
    a wiring track coupled to the amplifier; and
    a plurality of selector switches integrated with the plurality of resistors and coupled to the wiring track, wherein one of the plurality of selector switches is configured to be enabled to provide respective voltage to the amplifier via the wiring track while remaining selector switches of the plurality of selector switches remain disabled, wherein a group of resistors of the plurality of resistors are disposed between a respective PMOS and a respective NMOS transistor of a respective one of the plurality of selector switches.

11. The voltage generator circuit of claim 10, wherein a respective first end of each the group of resistors is coupled to a respective first contact disposed adjacent to a corresponding first metal region and a respective second end of each the group of resistors is coupled to a respective second contact disposed adjacent to a corresponding second metal region.

12. The voltage generator circuit of claim 11, wherein a segment of a metal layer is coupled to the respective one of the plurality of selector switches and extends vertically and overlaps each resistor of the group of resistors.

13. The voltage generator circuit of claim 10, wherein a respective gate of the PMOS transistor and a respective gate of the NMOS transistor each have a U shape.

14. The voltage generator circuit of claim 13, wherein the group of resistors includes at least three resistors.

15. The voltage generator circuit of claim 10, wherein the plurality of resistors includes a group of resistors aligned with one other in a first direction.

16. The voltage generator circuit of claim 15, wherein each of the group of resistors extending in a second direction in parallel, wherein the second direction is perpendicular to the first direction.

17. The voltage generator circuit of claim 15, wherein each of the group of resistors have a U-shape oriented with sides of the U-shape extending in parallel in a second direction, wherein the second direction is perpendicular to the first direction.

* * * * *